United States Patent [19]
Hirose et al.

[11] Patent Number: 5,900,780
[45] Date of Patent: * May 4, 1999

[54] AMPLIFIER CIRCUIT FOR CMOS OPERATIONAL AMPLIFIER

[75] Inventors: Miki Hirose; Kenji Kanoh, both of Tokyo, Japan

[73] Assignee: Mitsubishi Denki Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/692,275

[22] Filed: Aug. 5, 1996

[30] Foreign Application Priority Data

Sep. 20, 1995 [JP] Japan ................................ 7-241777

[51] Int. Cl.$^6$ ................................................. H03F 3/45
[52] U.S. Cl. ............................ 330/253; 330/255; 330/260
[58] Field of Search .................................. 330/253, 255, 330/260, 264, 267

[56] References Cited

U.S. PATENT DOCUMENTS

| | | | |
|---|---|---|---|
| 4,800,339 | 1/1989 | Tanimoto et al. | 330/255 X |
| 5,446,412 | 8/1995 | Kimyacioglu et al. | 330/255 |
| 5,537,079 | 7/1996 | Gosser et al. | 330/267 X |
| 5,606,287 | 2/1997 | Kobayashi et al. | 330/255 |

FOREIGN PATENT DOCUMENTS

| | | |
|---|---|---|
| 62-51305 | 3/1987 | Japan . |
| 62-82704 | 4/1987 | Japan . |
| 62-230206 | 10/1987 | Japan . |
| 63-207209 | 8/1988 | Japan . |

OTHER PUBLICATIONS

Phillip E. Allen et al., "TP 11.4: A 1V CMOS Opamp Using Bulk–Driven MOSFETs" ISSCC95, Session 11, Technology Directions: RF and Analog, Paper TP 11.4, 1995 IEEE International Solid–State Circuits Conference, Feb. 16, 1995, pp. 192, 193.

Rob van Dongen et al., "WP 3.1: A 1.5 V Class AB CMOS Buffer Amplifier for Driving Low–Resistance Loads, " ISSCC95, Session 3, Analog Techniques, Paper WP 3.1, 1995 IEEE International Solid–State Circuits Conference, Feb 15, 1995, pp. 48, 49.

R. van Dongen et al., "WP 3.1:A 1.5 V Class AB CMOS Buffer Amplifier for Driving Low–Resistance Loads," 1995 IEEE International Solid State Circuits Conference, pp. 48–49.

P.E. Allen et al., "TP 11.4: A 1V CMOS Opamp Using Bulk–Driven MOSFETs," 1995 IEEE International Solid–State Circuits Conference, pp. 192–193.

*Patent Abstracts of Japan*, Publication No. 59034706 A, which was published on Feb. 25, 1984.

*Primary Examiner*—James B. Mullins
*Attorney, Agent, or Firm*—Burns, Doane, Swecker & Mathis, LLP

[57] ABSTRACT

An output circuit 1 has a p-type MOS transistor Q1 connected between a power-voltage node and an output node, and an n-type MOS transistor Q2 connected between a ground-voltage node and the output node. A voltage-current conversion circuit 2 outputs a voltage according to the voltage difference between an input signal and the comparison voltage. According to the output from the voltage-current conversion circuit 2, a signal conversion circuit 3 controls the voltage of the gate electrode of the MOS transistor Q1 with a reference of a second specified voltage, and controls the voltage of the gate electrode of the n-type MOS transistor Q2 with a reference of a first specified voltage.

18 Claims, 16 Drawing Sheets

AMPLIFIER CIRCUIT FOR CMOS OPERATIONAL AMPLIFIER

BACKGROUND OF THE INVENTION

1. Field of the Invention

The present invention relates to an amplifier circuit using a class-AB CMOS operational amplifier, in particular, an amplifier circuit suitable for use as an audio amplifier circuit for a portable telephone.

2. Description of the Related Arts

An amplifier circuit using a class-AB CMOS amplifier has been widely utilized as an audio amplifier circuit, because of its various advantages as follows.

First, it consumes low amount of power since the output current, namely, the current consumed by the amplifier, is determined according to the current flowing through the loads connected to the output of the amplifier.

Second, it has small distortion in the output waveform and relatively low current flows when no signal is applied to the amplifier. In other words, the amplifier features an output waveform with a small distortion and low power consumption during idle periods.

Third, the amplifier has a relatively high output drive capacity. Fourth, the amplifier can provide an output having a relatively large voltage amplitude.

Currently, the use of portable telephones has been spreading, and various audio amplifier circuits used for the receiving circuit of such portable telephones have been explored.

There is a demand for an audio amplifier circuit used in portable telephones which is driven by a battery with a low voltage, for example, driven by a 3-V battery instead of a 5-V battery, and is low in cost.

In order to meet these demands, the inventors have tried to incorporate a receiving circuit, including an audio amplifier circuit in which class-AB CMOS operational amplifiers having the foregoing advantages are used, into a system LSI chip in which digital circuits are mainly used together with analog circuits. However, it was found that the mere direct incorporation of conventional class-AB CMOS operational amplifiers into a audio amplifier circuit for a portable telephone as it exists, makes it difficult to enlarge the output drive capacity and a voltage amplitude of the output waveform when used at a low power voltage, for example, with a 3-V voltage supply instead of a 5-V voltage supply.

SUMMARY OF THE INVENTION

The present invention has been created to solve the foregoing problems.

It is an object of the present invention to provide an amplifier circuit for a portable telephone, which has a large drive capacity and large output voltage amplitude at a low power voltage.

It is another object of the present invention to provide an amplifier circuit which can be driven with low power consumption.

It is further object of the present invention to provide an amplifier circuit with an improved allowance for discrepancy from design and an improved controllability.

An amplifier circuit according to the present invention comprises an output circuit having a p-type MOS transistor connected between a first power-voltage node and an output node, the gate electrode thereof being connected to a first input node, and an n-type MOS transistor connected between a ground-voltage node and the output node, the gate electrode thereof being connected to a second input node; a voltage-current conversion circuit having an inverted-input node to which an input signal is input and a non-inverted-input node to which a comparison or reference voltage is applied, the voltage-current conversion circuit outputting a value according to the voltage difference between the input signal and the comparison voltage; a signal conversion circuit for controlling the voltage of the second input node in the output circuit using as a reference a second specified voltage and also for controlling the voltage of the first input node in the output circuit using as a reference a first specified voltage, according to the output of the voltage-current conversion circuit; and a feedback circuit connected between the output node of the output circuit and the inverted-input node of the voltage-current conversion circuit.

DETAILED DESCRIPTION OF EXEMPLARY EMBODIMENTS

First Embodiment

Figure 1:
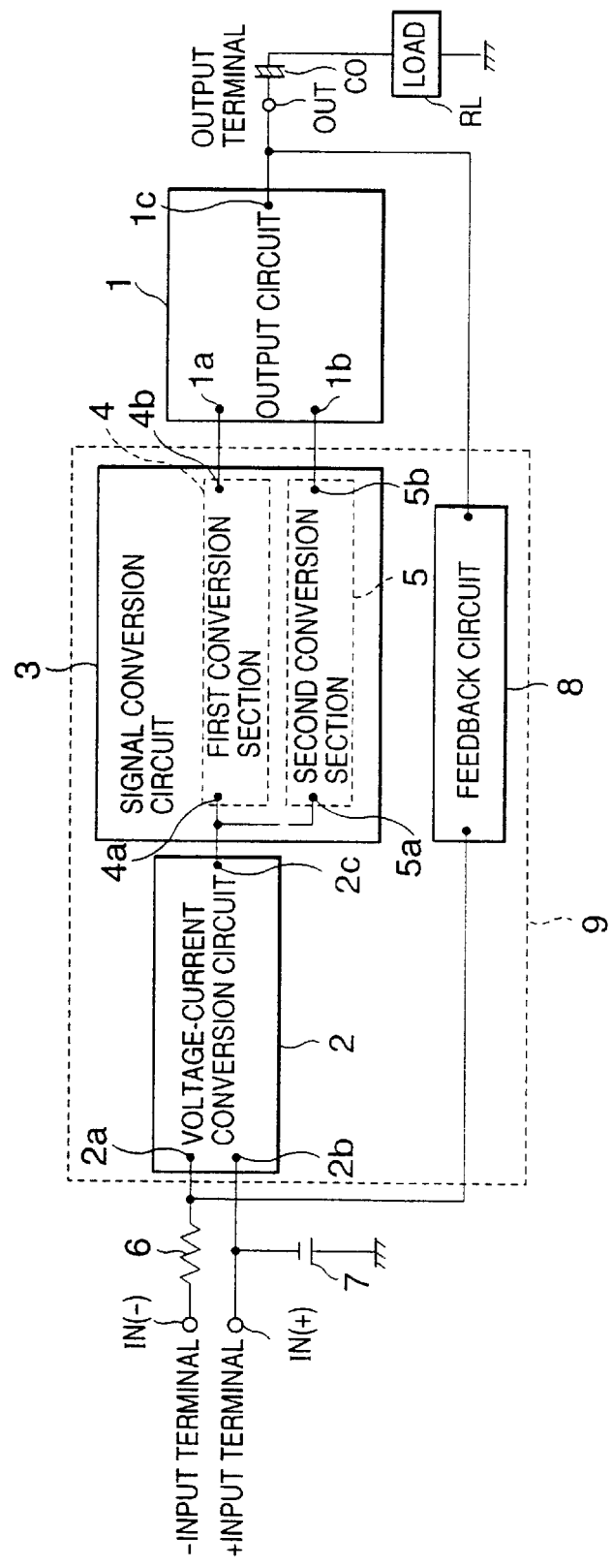
FIG. 1 is a block diagram of an amplifier circuit showing a first embodiment of the present invention.
Figure 2:
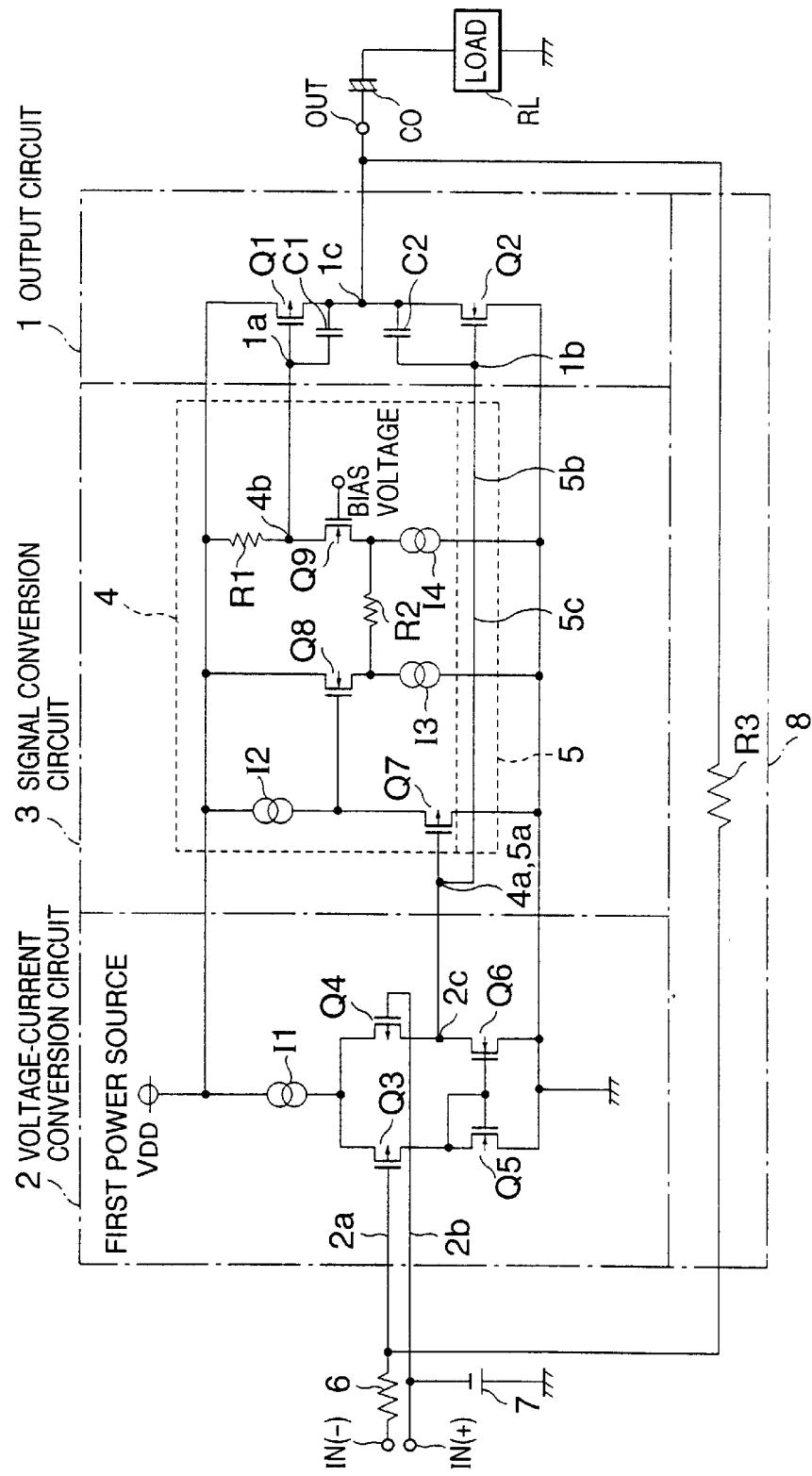
FIG. 2 is a circuit diagram of an amplifier circuit shown in FIG. 1, using class AB-CMOS operational amplifier.

FIGS. 1 and 2 are block and schematic diagrams of an amplifier circuit using a class-AB CMOS operational amplifier (hereinafter called op amp). There is shown in FIG. 1 an output circuit 1 for driving a load RL, such as a speaker or earphone, connected via capacitor C0 which is used for removing d.c. current. As shown in FIG. 2, the output circuit 1 comprises a first transistor Q1, e.g., a p-type MOS transistor, of which the gate electrode serving as a control electrode is connected to a first input node 1a, the source electrode serving as one main electrode is connected to a first power-voltage node to which a power voltage $V_{DD}$ (for example, 3 V in the first embodiment) is applied, and the drain electrode serving as the other main electrode is connected to an output node 1c. The output node 1c is the output OUT of the op amp. The output circuit 1 further includes a second transistor Q2, e.g., an n-type MOS transistor, of which the gate electrode serving as a control electrode is connected to a second input node 1b, the source electrode serving as one main electrode is connected to a ground-voltage node to which the ground voltage is applied, and the drain electrode serving as the other main electrode is connected to the output node 1c. A first capacitive component C1, such as a MOS capacitor, is connected between the control electrode and a main electrode connected to the output node 1c of the first transistor Q1, and a second capacitor C2, such as a MOS capacitor, is connected between the control electrode and a main electrode connected to the output node 1c of the second transistor Q2.

The first and second capacitive components C1 and C2 are provided to adjust a phase shift between the signals input to the first input node 1a and the second input node 1b. For example, they are used for adjusting a phase of a system in order to prevent oscillation caused by signal composition of the output and inverted input, for example, when the output terminal and the inverted input terminal of the op amp are connected to configure a feedback circuit.

There is also shown in FIG. 1 a voltage-current conversion circuit 2 for outputting a value proportional to the voltage difference between the signal (the signal biased by $V_{DD}/2$, i.e., half of the power voltage, $V_{DD}$) input to the inverted-input node 2a via an input resistor 6 from an inverted-input terminal IN(−) and the comparison or reference voltage ($V_{DD}/2$, half of the power voltage, $V_{DD}$) specified by a comparison-voltage generating means 7 and input to a non-inverted-input node 2b connected to a non-inverted-input terminal IN(+). As shown in FIG. 2, the voltage-current conversion circuit 2 controls the current flowing in transistors connected to the inverted-input node 2a and the non-inverted-input node 2b, and outputs current to the output node 2c according to the controlled current In other words, current flows from the output node 2c to an external circuit, or current flows from the external circuit into the output node 2c.

As shown in FIG. 2, the voltage-current conversion circuit 2 comprises a third transistor Q3, e.g., a p-type MOS transistor, of which the gate electrode serving as a control electrode is connected to the inverted-input node 2a, and a fourth transistor Q4, e.g., a p-type MOS transistor. The gate electrode of the fourth transistor Q4 serves as a control electrode and is connected to the non-inverted-input node 2b. The source electrode of the fourth transistor Q4 serves as one main electrode and is connected to the source electrode serving as one main electrode of the first transistor Q1. The drain electrode of the fourth transistor Q4 serves as the other main electrode is connected to an output node 2c. In the first embodiment, the fourth transistor Q4 is formed such that it has the same size as the third transistor Q3, namely, the same gate length and gate width to provide the same characteristics, and both transistors are configured as a pair of differential transistors.

The voltage-current conversion circuit 2 also comprises a fifth transistor Q5, e.g., an n-type MOS transistor, of which the source electrode is connected to the ground voltage node, the drain electrode is connected to the drain electrode of the first transistor Q1, and the gate electrode serving as a control electrode is connected to the drain electrode. The voltage-current conversion circuit 2 further includes a sixth transistor Q6, e.g., an n-type transistor, of which the source electrode is connected to the second power-voltage node, the drain electrode is connected to the drain electrode of the fourth transistor Q4, and the gate electrode is connected to the control gate of the fifth transistor Q5. The fifth and sixth transistors Q5 and Q6 form a current mirror circuit. In the first embodiment, the sixth transistor Q6 is made such that it has the same size as the fifth transistor Q5, that is, the same gate length and same gate width to provide the same characteristics. The same current as that flowing through the fifth transistor Q5 flows through the sixth transistor Q6.

There is also shown in FIG. 2 a first constant-current power supply I1 for supplying constant current i1 to the third transistor Q3 and the fourth transistor Q4, with the first power voltage $V_{DD}$ being supplied from the power-voltage node.

In FIG. 1, there is also shown a signal conversion circuit 3 for controlling the gate voltage of the first transistor Q1 in the output circuit 1 with the first specified voltage. In this embodiment, the first specified voltage is obtained by subtracting the gate-source voltage $V_{GS1(idle)}$ of the first transistor Q1 from the power voltage $V_{DD}$ applied to the first power-voltage node, in the state when no input signal is applied. No input signal is applied when an input signal is not applied to the inverted-input terminal IN(−), current does not flow from the output terminal OUT to load RL connected to the output terminal OUT via capacitor C0 or vice verse, and the specified current $I_{(idle)}$ flows through the first and second transistors Q1 and Q2. The first specified voltage is used as a reference. The signal conversion circuit 3 is also for controlling the gate voltage of the second transistor Q2 in the output circuit 1 with the second specified voltage. In the this embodiment, the second specified voltage is the gate-source voltage $V_{GS2(idle)}$ of the second transistor Q2 in the state when no signal is applied, which is lower than the first specified voltage, being used as a reference. In other words, the signal conversion circuit 3 receives the current flowing into the output node 2c of the voltage-current conversion circuit 2 and controls the current flowing into the first input node 1a and that flowing into the second input node 1b of the output circuit 1 and its corresponding voltages. The signal control circuit 3 comprises a first conversion section 4 for controlling the gate electrode of the first transistor Q1 in the output circuit 1, and a second conversion section 5 for controlling the gate electrode of the second transistor Q2 in the output circuit 1. The output voltage of the first conversion section 4 is generated according to that of the second conversion section 5.

The first conversion section 4 has an input node 4a connected to the output node 2c of the voltage-current conversion circuit 2, and an output node 4b connected to the first input node 1a of the output circuit 1. According to the output of the voltage-current conversion circuit 2 (in this embodiment, it is also the output of the second conversion section 5), the conversion section 4 controls the gate electrode of the first transistor Q1 in the output circuit 1 with the first specified voltage being used as a reference. In other words, the first conversion section 4 controls the current flowing into the first input node 1a in the output circuit 1 and its corresponding voltage by controlling the flow of current to the output node 4b. The current flowing to the output node 4b is controlled according to the voltage of the input node 4a, which is controlled in accordance with the current flowing into the output node 2c of the voltage-current conversion circuit 2. That is, the current flowing from the output node 2c to the input node 4a or the current flowing from the input node 4a to the output node 2c is controlled by the first conversion section 4.

The second conversion section 5 has an input node 5a connected to the output node 2c of the voltage-current conversion circuit 2, and an output node 5b connected to the second input node 1b of the output circuit 1. According to the output of the voltage-current conversion circuit 2, the conversion section 5 controls the gate electrode of the second transistor Q2 in the output circuit 1 with the second specified voltage being used as a reference. In other words, the conversion section 5 controls the current flowing into the first input node 1b in the output circuit 1 and its corresponding voltage, by controlling the flow of current to the output node 5b according to the voltage of the input node 5a, which is controlled in accordance with the current flowing into the output node 2c of the voltage-current conversion circuit 2. That is, the current flowing from the output node 2c to the input node 5a or the current flowing from the input node 5a to the output node 2c is controlled by the conversion section 5.

A detailed circuit of the signal conversion circuit 3 is shown in FIG. 2.

In FIG. 2, there is shown a seventh transistor Q7, e.g. a p-type MOS transistor, of which the gate electrode is connected to the input node 4a, and the drain electrode is connected to the ground-voltage node, and a second constant-current power source I2 for supplying constant current i2 to a constant-current supply node, with the power voltage $V_{DD}$ being supplied from the first power-voltage node. The constant-current supply node is connected to the source electrode of the seventh transistor Q7.

There is also shown an eighth transistor Q8, e.g. an n-type MOS transistor, of which the gate electrode is connected to the connection point of the constant-current supply node of the second constant-current power source I2 and the source electrode of the seventh transistor Q7, and the drain electrode is connected to the first power-voltage node, and a third constant-current power source I3 for drawing constant current i3 to the ground-voltage node from a constant-current drawing node, which is connected to the source electrode of the eighth transistor Q8.

There is also shown a load component R1 comprising a resistor component connected between the first power-voltage node and the output node 4b, and a ninth transistor Q9, e.g., an n-type MOS transistor, of which the drain electrode is connected to the load component R1. The specified bias voltage (in this embodiment, the sum of the gate-source voltage, $V_{GS2(idle)}$, of the second transistor Q2 and the gate-source voltage, $V_{GS7}$, of the seventh transistor Q7) is applied to the gate electrode of the ninth transistor Q9. The ninth transistor Q9 has the same channel length as the eighth transistor Q8 and a channel width n times that of the eighth transistor Q8, where "n" represents a certain ratio of the width $W_{Q8}$ of the eighth transistor Q8 to the width $W_{Q9}$ of the ninth transistor Q9, i.e., $W_{Q8}/W_{Q9}=1/n$. In this instance, the current flowing through the eighth and ninth transistors Q8 and Q9 is proportional to the width and leads to the following equation $I_{Q8}/I_{Q9}=1/n$ because each transistor has the same value in the gate potential and channel length.

There is also shown a fourth constant-current power source I4 for drawing constant current i4 to the ground-voltage node from a constant-current drawing node which is connected to the source electrode of the ninth transistor Q9. The fourth constant-current power source I4 is formed such that constant current i4 has a relationship of 1:n (=i3:i4) with constant current i3 flowing through the third constant-current power source I3. There is also shown a resistor component R2 connected between one main electrode of the eighth transistor Q8 and one main electrode of the ninth transistor Q9.

Resistance r1 of load component R1 is specified such that the product of r1 and i4 equals the gate-source voltage, $V_{GS1(idle)}$ of the first transistor Q1, obtained when no signal is applied.

The first conversion section 4 of the signal conversion circuit 3 comprises the seventh transistor Q7, the second constant-current power source I2, the eighth transistor Q8, the third constant-current power source I3, load component R1, the ninth transistor Q9, the fourth constant-current power source I4, and resistor component R2.

Wire 5c connects the input node 5a to the output node 5b. The current corresponding to the voltage at the input node 5a, which is controlled by the current flowing into the output node 2c from input node 5a or the current flowing from the output node 2c to the input node 5a, flows across wire 5c to the output node 5b. The wire 5c is a part of the second conversion circuit 5, which controls the current flowing through the first input node 1b of the output circuit 1 and its corresponding voltage in the signal conversion circuit 3. The second conversion circuit 5 may be configured such that the input node 5a is also used as the output node 5b without using the wire 5c.

In FIG. 1, there is also shown a feedback circuit 8 connected between the output node 1c of the output circuit 1 and the non-inverted-input node 2a of the voltage-current conversion circuit 2. It is used for feeding back the voltage at the output node 1c in the output circuit 1 to the non-inverted-input node 2a in the voltage-current conversion circuit 2, and comprises another resistive component R3 as shown in FIG. 2, for example.

A control circuit 9 which comprises the voltage-current conversion circuit 2 and the signal conversion circuit 3 controls the voltage at the second input node 1b with the second specified voltage being used as a reference, as well as the voltage at the first input node 1a of the output circuit 1 with the first specified voltage being used as a reference, according to the voltage difference between the signal input to the non-inverted-input terminal IN(−) and the comparison voltage output from the comparison-voltage generating means 7.

Operations in the amplifier circuit which has the above configuration will be described below.

Described first will be operations in the state in which no signal is applied to the non-inverted input terminal IN(−), which means that no current flows from the output terminal OUT to load RL connected to the output terminal OUT via capacitor C0 or vice verse.

Since no signal is applied, the bias voltage, $V_{DD}/2$, is applied to the inverted-input terminal IN(−), and the comparison voltage, $V_{DD}/2$, is applied to the non-inverted-input terminal IN(+).

Since the same voltage, $V_{DD}/2$, is applied to the inverted-input node 2a and the non-inverted-input node 2b of the voltage-current conversion circuit 2, the same voltage is applied to the gate electrodes of the third transistor Q3 and the fourth transistor Q4, and consequently the same current flows through the third transistor Q3 and the fourth transistor Q4. The current is half of the first constant current i1 output from the first constant-current power source I1.

Since a current of i½ flows through the third transistor Q3, the same current flows through the fifth transistor Q5 Consequently, a current of i½ flow through the sixth transistor Q6, which forms the current mirror circuit together with the fifth transistor Q5.

Since the same current flows through the sixth transistor Q6 and the fourth transistor Q4, current does not flow from the output node 2c in the voltage-current conversion circuit 2 to the input node 4a of the first conversion section 4 or the input node 5a of the second conversion section 5 in the signal conversion circuit 3. Current also does not flow from the input nodes 4a or 5a to the output node 2c.

The output node 5b, which is directly connected to the input node 5a, is in the same state as the node 5a. Since the voltage at the output node 5b is set to the gate-source voltage, $V_{GS2(idle)}$, of the second transistor Q2 at the state in which the specified current, $I_{(idle)}$, flows into the second transistor Q2, the second input node 1b of the output circuit 1 has a voltage of $V_{GS2(idle)}$. This voltage is applied to the gate electrode of the second transistor Q2, the specified current, $I_{(idle)}$, flowing into the second transistor Q2. In this case, since the second transistor Q2 is an n-type MOS transistor, it can operate in a slight conductivity state close to the non-conductivity state (the gate voltage is set to near the threshold voltage of the n-type MOS transistor), and the specified current can be very low current.

The seventh transistor Q7, a p-type MOS transistor, of which the control electrode is connected to the input node 4a, becomes conductive since a low voltage of $V_{GS2(idle)}$ is applied to the gate electrode. Constant current i2 flows into the seventh transistor Q7 from the second constant-current power source I2. As a result, the voltage of the gate electrode of the eighth transistor Q8 is higher than that of the gate electrode of the seventh transistor Q7 by the gate-source voltage of the seventh transistor Q7, $V_{GS7}$, that is, $V_{GS2(idle)}+V_{GS7}$.

Since the same voltage is applied to the gate electrodes of the eighth and ninth transistors Q8 and Q9 in this case, the magnitude ratio of the current flowing through the eighth transistor Q8 and that flowing through the ninth transistor Q9 is 1:n, as explained above.

Because the magnitude ratio of constant current i3 of the third constant-current power source I3 and constant current i4 of the fourth constant-current power source I4 is also 1:n, current i3 flows into the eighth transistor Q8 and current i4 flows into the ninth transistor Q9. No current flows through resistor component R2.

Current i4 flows through load component R1 and the voltage drop across load component R1 is i4×r1. This voltage drop, i4×r1, is set to the same voltage as the gate-source voltage, $V_{GS1(idle)}$, of the first transistor Q1 in the state in which very low current $I_{(idle)}$ flows through the first transistor Q1 under a slight-conductivity state close to non-conductivity state (the gate voltage of the first transistor Q1, a p-type MOS transistor, is set to near the threshold voltage of the first transistor Q1). Therefore, the voltage at the output node 4b is equal to the power voltage $V_{DD}$ applied to the power-voltage node minus i4 times r1, and the voltage at the first input node 1a in the output circuit 1 is equal to $V_{DD}$ minus i4 times r1 ($=V_{GS1(idle)}$), resulting in flowing the specified current, $I_{(idle)}$, into the first transistor Q1. Since the first transistor Q1 is a p-type MOS transistor, it can operate in a slight conductivity state close to the non-conductivity state, and the specified current can be very low current.

Because the signal conversion circuit 3 operates in the following way, the output nodes 5b and 4b of the signal conversion circuit 3 are maintained to be $V_{GS2(idle)}$ and $V_{DD}-V_{GS1(idle)}$, respectively, when no signal is applied. When the voltage at the output node 2c of the voltage-current conversion circuit 2 becomes higher than $V_{GS2(idle)}$, the voltages at the output nodes 5b and 4b are made higher to increase the conductivity level of the second transistor Q2, causing the current flowing through the second transistor Q2 to be higher than $I_{(idle)}$, and to reduce the conductivity level of the first transistor Q1, causing the current flowing through the first transistor Q1 to be lower than $I_{(idle)}$. Thereby the voltage at the output node 1c in the output circuit 1 is reduced, the voltage at the non-inverted-input node 2a of the voltage-current conversion circuit 2 is reduced, and the voltage of the output node 2c of the voltage-current conversion circuit 2 is reduced, while keeping the voltages at the output nodes 5b and 4b at $V_{GS2(idle)}$ and $V_{DD}-V_{GS1(idle)}$, respectively.

When the voltage at the output node 2c of the voltage-current conversion circuit 2 becomes lower than $V_{GS2(idle)}$, the voltages at the output nodes 5b and 4b are made lower to reduce the conductivity level of the second transistor Q2, causing the current flowing through the second Q2 to be lower than $I_{(idle)}$, and to increase the conductivity level of the first transistor Q1, causing the current flowing through the first transistor Q1 to be higher than $I_{(idle)}$. Thereby, the voltage at the output node 1c in the output circuit 1 is increased, the voltage at the non-inverted-input node 2a of the voltage-current conversion circuit 2 is increased, and the voltage of the output node 2c of the voltage-current conversion circuit 2 is increased, keeping the voltages at the output nodes 5b and 4b at $V_{GS2(idle)}$ and $V_{DD}-V_{GS1(idle)}$, respectively.

As a result, although very low current $I_{(idle)}$ flows into the first and second transistors Q1 and Q2, which is required to smoothly change the flow of current when the first and second transistors Q1 and Q2 switch between conductivity and non-conductivity states in order to obtain stable output waveform at the output node 1c, neither current flows from the output node 1c of the output circuit 1 to load RL connected to the output terminal OUT or vice versa.

Operations in a case when an input signal is applied to the inverted-input terminal IN(-) of the op amp will be described next by referring to waveform of the main signals shown in FIGS. 3(a)–3(f) (for convenience, it is assumed the input signal be a sine-wave signal).

The description will be made in a case in which the input signal (shown in FIG. 3(a)) is negative (in the first period shown in FIGS. 3(a)–(f)) against the bias voltage, $V_{DD}/2$.

When the input signal is negative against $V_{DD}/2$, the voltage at the inverted-input node 2a is lower than that at the non-inverted-input node 2b in the voltage-current conversion circuit 2. According to this voltage difference, since the conductivity level of the third transistor Q3 is higher than that of the fourth transistor Q4, more current flows through the third transistor Q3 than flows through the fourth transistor Q4. A current of i½+Δi1 flows into the third transistor Q3, and a current of i½-Δi1 flows into the fourth transistor Q4, where i1 is the current output from the constant-current power source I1 and Δi1 is a current increment increasing or decreasing depending on the voltage difference.

A current of i½+Δi1 flows into the fifth transistor Q5 and a current of i½+Δi1 also flows into the sixth transistor Q6, which forms the current mirror circuit together with the fifth transistor Q5.

A current of i½−Δi1 flows into the fourth transistor Q4 and a current of i½+Δi1 flows into the sixth transistor Q6. Then, a current of 2Δi1 flows into the sixth transistor Q6 from the input node 4a of the first conversion section 4 and the input node 5a of the second conversion section 5 of the signal conversion circuit 3.

The voltage at the input node 4a of the first conversion section 4 and the input node 5a of the second conversion section 5 changes to a level lower than the gate-source voltage, $V_{GS2(idle)}$, obtained when no signal is applied, of the second transistor Q2, according to the current difference 2Δi1. The voltage change at the input node 5a of the second conversion section 5 is the same as that at the output node 5b. The voltage, $V_{GS2}$, applied to the gate electrode of the second transistor Q2 is made lower than $V_{GS2(idle)}$.

The second transistor Q2, an n-type MOS transistor, is in a state which falls in the range from the non-conductivity state to a slight conductivity state close to the non-conductivity state. The current flowing through the second transistor Q2 is set to a value ranging from a level further lower than very low current $I_{(idle)}$ to 0 (see FIG. 3(d)).

The seventh transistor Q7, which connects at its gate electrode to the input node 4a of the signal conversion circuit 3, remains conductive and constant current i2 continues flowing from the second constant-current power source I2, because a lower voltage than $V_{GS2(idle)}$ is applied to the gate electrode. The voltage at the gate electrode of the eighth transistor Q8 becomes $V_{GS2}+V_{GS7}$, which is lower than $V_{GS2(idle)}+V_{GS7}$, because the voltage at the input node 4a is $V_{GS2}$, which is lower than $V_{GS2(idle)}$.

Therefore, since the gate voltage of the eighth transistor Q8 is lower than that ($V_{GS2(idle)}+V_{GS7}$) of the ninth transistor Q9, less current (see FIG. 3(c)) than constant current i3 of the third constant-current power source I3 flows into the eighth transistor Q8, and more current (see FIG. 3(c)) than constant current i4 of the fourth constant-current power source I4 flows into the ninth transistor Q9. Current flows from the ninth transistor Q9 to the third constant-current power source I3 via resistive component R2.

Thus, since the current flowing through the ninth transistor Q9 is higher than constant current i4 of the fourth constant-current power source I4, the voltage drop across load component R1 becomes large, making the voltage at the first input node 1a of the output circuit 1, that is, the gate voltage of the first transistor Q1, lower than $V_{DD}-V_{GS1(idle)}$ (see FIG. 3(d)). The conductivity level of the first transistor Q1, a p-type MOS transistor, becomes high, and the current flowing through the first transistor Q1 becomes higher than $I_{(idle)}$.

Because the current flowing through the first transistor Q1 is higher than $I_{(idle)}$ and the current flowing through the second transistor Q2 is lower than $I_{(idle)}$, current flows from the output node 1c of the output circuit 1 to load RL connected to the output terminal OUT (see FIG. 3(e)).

As a result, the voltage (output signal) at the output node 1c of the output circuit 1 becomes higher than $V_{DD}/2$ (see FIG. 3(d)).

Voltage changes at the first and second input nodes 1a and 1b of the output circuit are negatively fed back to the non-inverted-input node 2a through capacitors C1 and C2 and feedback resistor R3 to stabilize the voltage at the non-inverted-input node 2a.

FIG. 3(f) shows the current consumed in the output circuit 1.

Figure 3:
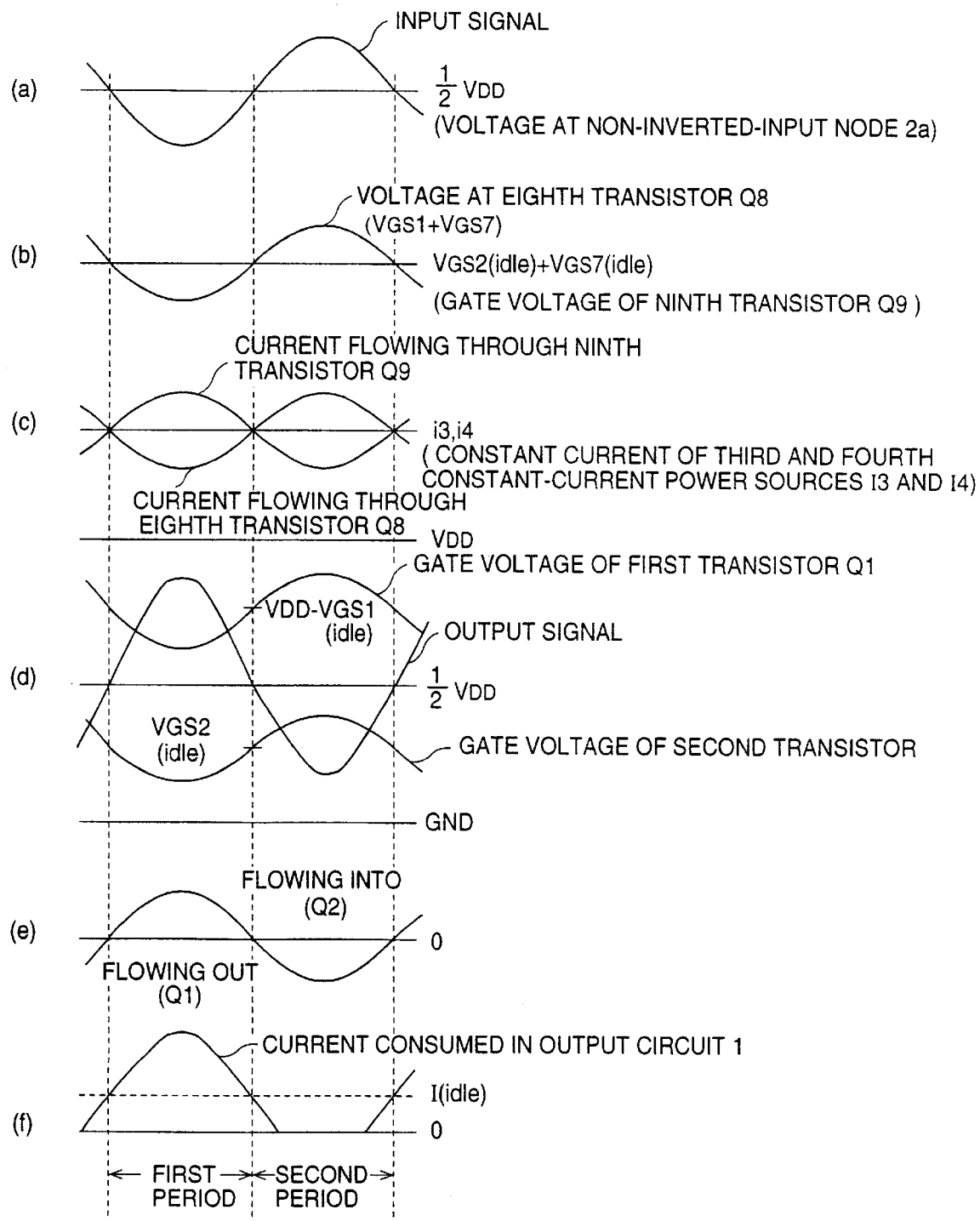
FIGS. 3(a)–3(f) are diagrams showing the waveforms of the main sections in the first embodiment of the present invention.

Next, the description will be made in a case in which the input signal (shown in FIG. 3(a)) is positive (in the second period shown in FIG. 3) against the bias voltage, $V_{DD}/2$.

When the input signal is positive against $V_{DD}/2$, the voltage at the inverted-input node 2a is higher than that at the non-inverted-input node 2b in the voltage-current conversion circuit 2. According to this voltage difference, since the conductivity level of the third transistor Q3 is lower than that of the fourth transistor Q4, less current flows through the third transistor Q3 than flows through the fourth transistor Q4. A current of i½−Δi1 flows into the third transistor Q3, and a current of i½+Δi1 flows into the fourth transistor Q4, where i1 is the current output from the constant-current power source I1 and Δi1 is a current increment increasing or decreasing depending on the voltage difference.

A current of i½−Δi1 flows into the fifth transistor Q5 and a current of i½−Δi1 also flows into the sixth transistor Q6, which forms the current mirror circuit together with the fifth transistor Q5.

Thus, a current of i½+Δi1 flows into the fourth transistor Q4 and a current of i½−Δi1 flows into the sixth transistor Q6. Then, a current of 2Δi1 flows from the fourth transistor Q4 into the input node 4a of the first conversion section 4 and the input node 5a of the second conversion section 5 of the signal conversion circuit 3.

The voltage at the input node 4a of the first conversion section 4 and the input node 5a of the second conversion section 5 changes to a level higher than the gate-source voltage, $V_{GS2(idle)}$, obtained when no signal is applied, of the second transistor Q2 according to the current difference 2Δi1. The voltage change at the input node 5a of the second conversion section 5 is the same as that at the output node 5b. The voltage applied to the gate electrode of the second transistor Q2 is made higher than $V_{GS2(idle)}$.

The second transistor Q2, an n-type MOS transistor, is then in a conductivity state which has a higher conductivity level than a slight conductivity state close to the non-conductivity state. The current flowing through the second transistor Q2 is set to a value higher than current $I_{(idle)}$ (see FIG. 3(d)).

The seventh transistor Q7, which connects to the input node 4a at its gate electrode, remains conductive because a higher voltage applied to the gate electrode than $V_{GS2(idle)}$ is not high enough to change the conductivity level, and constant current i2 continues flowing from the second constant-current power source I2. The voltage at the gate electrode of the eighth transistor Q8 becomes $V_{GS2}+V_{GS7}$, which is higher than $V_{GS2(idle)}+V_{GS7}$, because the voltage at the input node 4a is $V_{GS2}$, which is higher than $V_{GS2(idle)}$.

Therefore, the gate voltage of the eighth transistor Q8 is higher than that ($V_{GS2(idle)}+V_{GS7}$) of the ninth transistor Q9. More current (see FIG. 3(c)) than constant current i3 of the third constant-current power source I3 flows into the eighth transistor Q8, and less current (see FIG. 3(c)) than constant current i4 of the fourth constant-current power source I4 flows into the ninth transistor Q9. Current flows from the eighth transistor Q8 to the fourth constant-current power source I4 via resistive component R2.

Since the current flowing through the ninth transistor Q9 is lower than constant current i4 of the fourth constant-current power source I4, the voltage drop across load component R1 becomes small, making the voltage at the first input node 1a of the output circuit 1, that is, the gate voltage of the first transistor Q1, higher than $V_{DD}-V_{GS1(idle)}$ (see FIG. 3(d)). The conductivity level of the first transistor Q1, a p-type transistor, becomes low, and the current flowing through the first transistor Q1 becomes lower than $I_{(idle)}$.

Because the current flowing through the first transistor Q1 is lower than $I_{(idle)}$ and the current flowing through the second transistor Q2 is higher than $I_{(idle)}$, current flows from the output node 1c of the output circuit 1 to load RL connected to the output terminal OUT (see FIG. 3(e)).

As a result, the voltage (output signal) at the output node 1c of the output circuit 1 becomes lower than $V_{DD}/2$ (see FIG. 3(d)).

Voltage changes at the first and second input nodes 1a and 1b of the output circuit are negatively fed back to the non-inverted-input node 2a through capacitors C1 and C2 and feedback resistor R3 to stabilize the voltage at the non-inverted-input node 2a.

FIG. 3(f) shows the current consumed in the output circuit 1.

In the amplifier circuit using an op amp configured as described above, although $I_{(idle)}$ flows when no signal is applied in order to obtain stable output waveform at the output node 1c, $I_{(idle)}$ can be a stable and very low current since the p-type MOS transistor Q1 is connected between the power-voltage node and the output node 1c, and the n-type MOS transistor Q2 is connected between the output node 1c of the output circuit 1 and the ground node.

Receiving the output of the voltage-current conversion circuit 2 comprising the differential amplifier circuit which receives the input signal, the signal conversion circuit 3 applies signals changing in phase to the gate electrode of the n-type MOS transistor Q2 and the gate electrode of the p-type MOS transistor Q1 according to the output of the circuit 2. The voltage appearing at the output node 1c is not influenced by the gate electrode of the first, p-type MOS transistor Q1 or the gate electrode of the second, n-type MOS transistor Q2. Ideally, the amplitude can be stably obtained between the power voltage, $V_{DD}$, applied to the power-voltage node and the ground voltage applied to the ground-voltage node.

Figure 4:
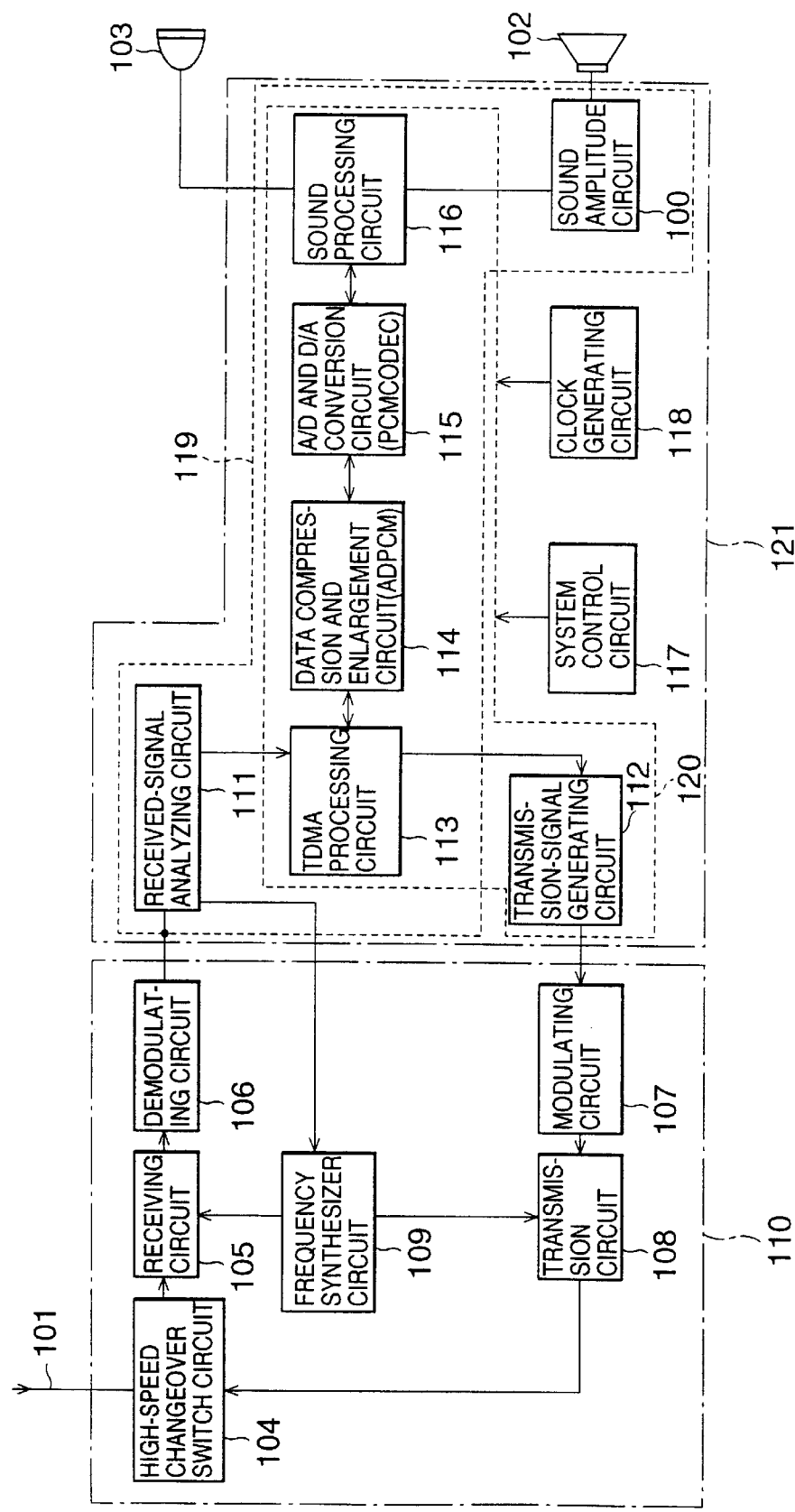
FIG. 4 is a block diagram showing an embodiment of a semiconductor integrated circuit device for a portable telephone to which an embodiment of an amplifier circuit of the present invention is applied.

When the amplifier circuit using the op amp as described above was used as a sound amplifier circuit in the receiving circuit of a portable telephone as described in FIG. 4, for example, the amplitude of the output signal appearing at the output node 1c ranged from a lower limit of 300 mV to a upper limit of 2.7 V (=3 V−300 mV) with the power voltage, $V_{DD}$, of 3 V.

This lower limit corresponds to the voltage drop (50 mA×6 Ω) across the second, n-type MOS transistor Q2 (its "on" resistance is 6 Ω) by the maximum current of 50 mA which is required to drive load RL, such as an earphone or a speaker, and flows into the second transistor Q2. The upper limit corresponds to the voltage obtained by subtracting from the power voltage $V_{DD}$ the voltage drop (50 mA×6 Ω) across the first, p-type MOS transistor Q1 (its "on" resistance is 6 Ω) by the maximum current of 50 mA which is required to drive an earphone and speaker and flowing from the first transistor Q1.

When the amplifier circuit is used as a sound amplifier circuit in the receiving circuit of a portable telephone as shown in FIG. 4, the receiving circuit for receiving and demodulated a signal according to a signal received by an antenna 101 and for outputting the sound signal to the earphone and speaker can be configured as one semiconductor integrated circuit device using MOS transistors.

In FIG. 4, there is shown the antenna 101, an earphone and speaker 102 serving as load RL, a microphone 103, a high-speed changeover switch 104 for selecting whether receiving a signal received by the antenna or sending a transmission signal to the antenna 101, a receiving circuit 105 for receiving, via the switch 104, the signal received by the antenna 101, a demodulating circuit 106 for demodulating the signal received by the receiving circuit, a modulating circuit 107 for modulating the signal based on the signal sent from the microphone 103, a transmission circuit 108 for outputting a transmission signal for sending the modulated signal of the modulating circuit 107 to the antenna 101 via the switch circuit 104, and a frequency synthesizer circuit 109 for controlling the receiving circuit 105 and the transmission circuit 108.

These components make up a demodulating and modulating circuit 110 for outputting the demodulated signal obtained by demodulating the signal received by the antenna 101, and for outputting the transmission signal from the antenna 101 by modulating the signal based on a signal from the microphone 103. The modulating and demodulating circuit 110 can include the switch circuit 104, the receiving circuit 105, the demodulating circuit 106, the modulating circuit 107, the transmission circuit 108, and the frequency synthesizer circuit 109 formed as one semiconductor integrated circuit device comprising GaAs semiconductor substrate.

There is also shown a received-signal analyzing circuit 111 for receiving the demodulated signal from the demodulating circuit 106, a transmission-signal generating circuit 112 for outputting to the modulating circuit 107 by receiving and processing an analog signal based on the signal from the microphone 103, and a TDMA processing circuit 113 for outputting the digital signal by receiving and processing the signal processed in the received-signal analyzing circuit 111, and for outputting the analog signal to the transmission-signal generating circuit 112 by receiving and processing a digital signal based on a signal from the microphone 103.

A data compression and enlargement circuit (ADPCM) 114 enlarges and outputs the digital signal processed in the TDMA processing circuit 113, and receives and compresses the digital signal based on the signal from the microphone 103 to output to the TDMA processing circuit 114. An A/D and D/A conversion circuit (PCMCODEC) 115 converts the enlarged signal from the data compression and enlargement circuit to the analog signal and outputs it, and converts the analog signal based on the signal from the microphone 103 to the digital signal and outputs it to the data compression and enlargement circuit 114.

There is also shown a sound processing circuit 116 for receiving and processing the analog signal converted in the A/D and D/A conversion circuit 115 to output to the sound amplifier circuit 100 comprising the amplifier circuit shown in FIGS. 1 and 2 as the input signal, and for receiving and processing the signal from the microphone 103 to output it to the A/D and D/A conversion circuit 115. Additionally shown is a system control circuit (MCU) 117 for outputting control signals to control the received-signal analyzing circuit 111, the transmission-signal generating circuit 112, the TDMA processing circuit 113, the data compression and enlargement circuit 114, the A/D and D/A conversion circuit 115, the sound processing circuit 116, and the sound amplifier circuit 100, a clock generating circuit 118 for outputting clock signals to the received-signal analyzing circuit 111, the transmission-signal generating circuit 112, the TDMA processing circuit 113, the data compression and enlargement circuit 114, the A/D and D/A conversion circuit 115, the sound processing circuit 116, and the sound amplifier circuit 100.

A receiving circuit 119 for receiving and processing the demodulated signal from the demodulating circuit 106 to output to the earphone or speaker 102 as a sound signal comprises the sound amplifier circuit 100 and the receiving-system circuit for processing the demodulated signal from the demodulating circuit 106 including the received-signal analyzing circuit 111, the TDMA processing circuit 113, the data compression and enlargement circuit 114, the A/D and D/A conversion circuit 115, and the sound processing circuit 116. A transmission circuit 120 for receiving and processing the signal from the microphone 103 to output the signal to be sent from the antenna 101 to the modulating circuit 107 comprises the transmission-system circuit for processing the signal from the microphone 103 including the transmission-signal generating circuit 112, the TDMA processing circuit 113, the data compression and enlargement circuit 114, the A/D and D/A conversion circuit 115, and the sound processing circuit 116.

The receiving and transmission circuit 121 comprises the receiving circuit 119, the transmission circuit 120, the system control circuit 117, and the clock generating circuit 118. The receiving and transmission circuit 121 uses MOS transistors for all transistors and is formed as one semiconductor integrated circuit device using a silicon semiconductor substrate.

Second Embodiment

Figure 5:
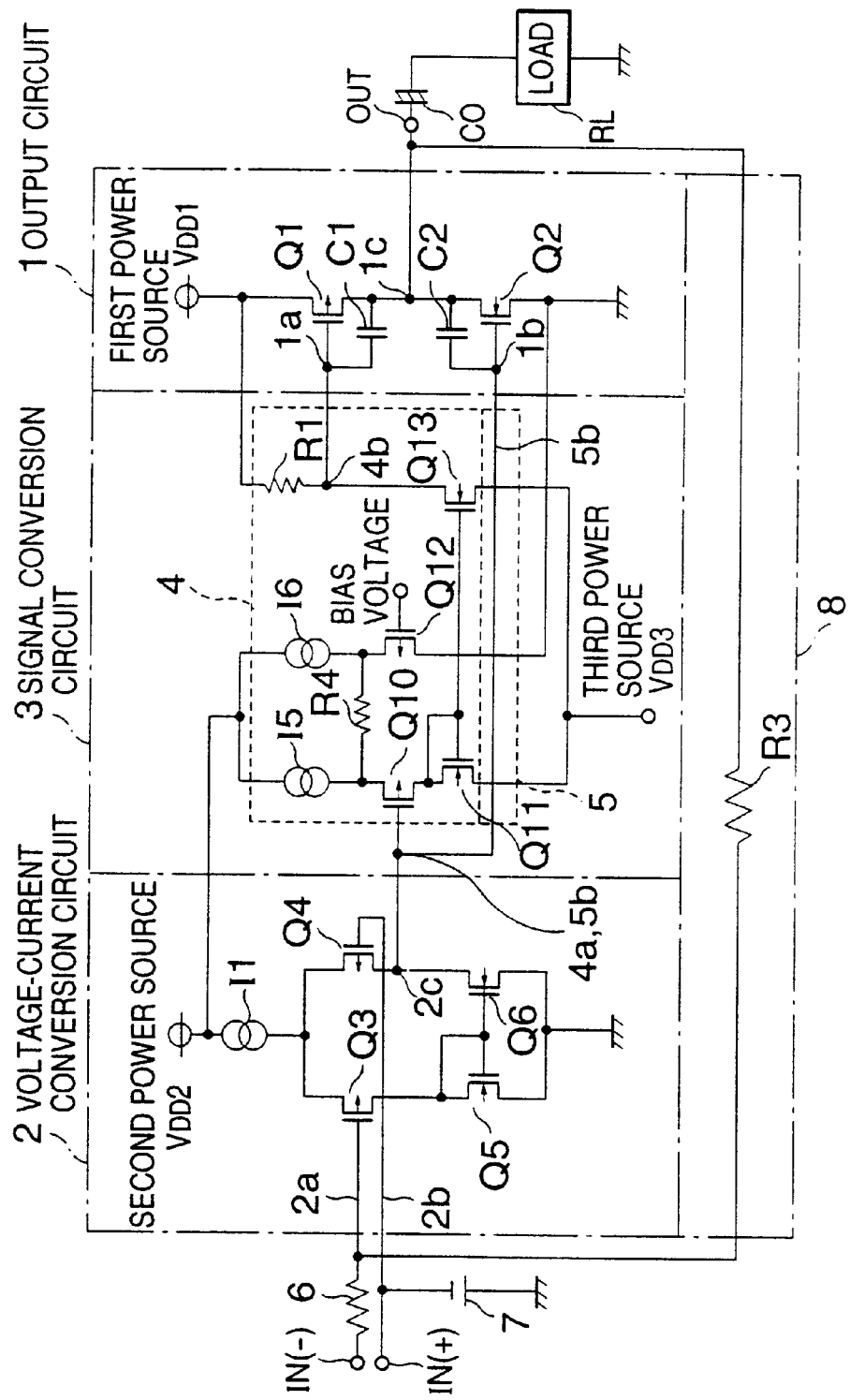
FIG. 5 is a circuit diagram showing a second embodiment of the present invention.

FIG. 5 shows an amplifier circuit using a class-AB CMOS operational amplifier (hereinafter called op amp) according to a second embodiment of the present invention. The second embodiment differs from the first embodiment, shown in FIGS. 1 and 2, in that the power-voltage ranges for the voltage-current conversion circuit 2 and the signal conversion circuit 3 are greater than that for the output circuit 1, and consequently the circuit configuration of the signal conversion circuit 3 is slightly different. The other portions are the same.

In FIG. 5, the same symbols as those used in FIGS. 1 and 2 indicate the same or the corresponding portions. An output circuit 1 is connected between a ground-voltage node and a first power-voltage node to which a first power voltage $V_{DD1}$ (in this embodiment, for example, 1.0 V) is applied. The output circuit 1 is driven by a power voltage of $V_{DD}$ and has the same detailed configuration as that described in the first embodiment.

A voltage-current conversion circuit 2 is connected between the ground-voltage node and a second power-voltage node to which a second power voltage $V_{DD2}$ (in this embodiment, for example, 2.5 V) which is higher than the first power voltage, $V_{DD1}$, is applied. The voltage-current conversion circuit 2 is driven by a power voltage of $V_{DD2}$ and has the same detailed configuration as that described the first embodiment.

A signal conversion circuit 3 is connected between the second power-voltage node and a third power-voltage node to which a negative voltage, $V_{DD3}$ (in this embodiment, for example, −1.0 V), which is lower than the ground voltage, is applied. The signal conversion circuit 3 is driven by a power voltage of $V_{DD2}-V_{DD3}$, which has a greater power-voltage range than that of the output circuit 1, $V_{DD1}$, and that of the voltage-current conversion circuit 2, $V_{DD2}$. The signal conversion circuit 3 controls the gate voltage of the first transistor Q1 in the output circuit 1 with the first specified voltage (in this embodiment, the voltage obtained by subtracting the gate-source voltage $V_{GS1(idle)}$ of the first transistor Q1, in the state when no input signal is applied, from the power voltage $V_{DD1}$ applied to the first power-voltage node) being used as a reference, and controls the gate voltage of the second transistor Q2 in the output circuit 1 with the second specified voltage (in this embodiment, the voltage which is equal to the gate-source voltage $V_{GS2(idle)}$ of the second transistor Q2 in the state when no signal is applied), which is lower than the first specified voltage, being used as a reference.

The signal conversion circuit 3 comprises a first conversion section 4 for controlling the gate electrode of the first transistor Q1 in the output circuit 1, and a second conversion section 5, which is the same as that used in the first embodiment for controlling the gate electrode of the second transistor Q2 in the output circuit 1. The output voltage of the first conversion section 4 is generated according to that of the second conversion section 5.

A first conversion section 4 comprises the 10th to 13th transistors Q10 to Q13, the fifth and sixth constant-current power sources I5 and I6, load component R1 and resistive component R4.

The tenth transistor Q10 is a p-type MOS transistor in which the gate electrode serving as a control electrode is connected to the input node 4a.

The fifth constant-current power source I5 supplies constant current i5 by receiving the second power voltage, $V_{DD2}$, from the second power-voltage node. The constant-current supply node is connected to the source electrode serving as one main electrode of the tenth transistor Q10.

The eleventh transistor Q11 is an n-type MOS transistor in which the source electrode serving as one main electrode is connected to the third power-voltage node, and the drain electrode serving as the other main electrode and the gate electrode serving as a control electrode are connected to the drain electrode serving as one main electrode of the tenth transistor Q10.

The twelfth transistor Q12 is a p-type MOS transistor in which the drain electrode serving as one main electrode is connected to the ground-voltage node, and the specified bias voltage is applied to the gate electrode serving as a control electrode. In this embodiment, the voltage obtained by subtracting the voltage difference between the second power voltage $V_{DD2}$ applied to the second power-voltage node and the third power voltage $V_{DD3}$ applied to the third power-voltage node from the sum of the gate-source voltage, $V_{GS2(idle)}$, of the second transistor Q2, the gate-source voltage $V_{GS10}$ of the tenth transistor Q10, and the gate-source voltage $V_{GS11}$ of the eleventh transistor Q11, which are obtained when no signal is applied. The twelfth transistor Q12 has the same channel length as the tenth transistor Q10 and has the channel width n times that of the tenth transistor Q10, where "n" represents a certain ratio of the width $W_{Q10}$ of the tenth transistor Q10 to the width $W_{Q12}$ of the twelfth transistor Q12, i.e., $W_{Q10}/W_{Q12}=1/n$.

The sixth constant-current power source I6 supplies constant current i6 by receiving the second power voltage, $V_{DD2}$, from the second power-voltage node. The constant-current supply node is connected to the source electrode serving as one main electrode of the twelfth transistor Q12. The sixth constant-current power source is formed such that constant current i6 has a relationship of 1:n (=i5:i6) with constant current i5 flowing through the constant-current power source I5.

The resistive component R4 is connected between one main electrode of the tenth transistor Q10 and one main electrode of the eleventh transistor Q11.

Load component R1 is connected between the first power-voltage node and the output node 4b.

In the thirteenth transistor Q13, the drain electrode serving as one main electrode is connected to the load component, the gate electrode serving as a control electrode is connected to the control electrode of the eleventh transistor Q11, and the other main electrode is connected to the third power-voltage node. The thirteenth transistor Q13 forms a current mirror circuit together with the eleventh transistor Q11. In the second embodiment, the thirteenth transistor Q13 is formed such that it has the same size and the same characteristics as the eleventh transistor Q11 and the current having the same amplitude as the current flowing through the eleventh transistor Q11 flows through the thirteenth transistor Q13.

Resistance r1 of the load component R1 is specified such that the product of r1 and i5 equals the gate-source voltage, $V_{GS1(idle)}$, obtained when no signal is applied, of the first transistor Q1.

In this embodiment, power voltage $V_{DD1}$ supplied to the first power-voltage node is supplied from, for example, one manganese dry cell or nickel-cadmium (Ni-Cd) dry cell, and the power voltages $V_{DD2}$ and $V_{DD3}$ supplied to the second and third power-voltage nodes are supplied from a DC-DC converter (not shown) for increasing and decreasing voltages, which is integrated with the amplifier circuit, by manipulating the power voltage supplied from, for example, one manganese dry cell or nickel-cadmium (Ni-Cd) dry cell. The desired operations can be obtained with no difficulty by directly supplying the power to the output circuit 1, which requires high current as drive current, and by supplying from the DC-DC converter or the like the power to the voltage-current conversion circuit 2 and the signal conversion circuit 3, which does not require high current.

Operations in the amplifier circuit using the op amp configured as above will be described next.

First, operations performed when no signal is applied will be described.

Since the same voltage, $V_{DD}/2$, is applied to the inverted-input node 2a and the non-inverted-input node 2b of the voltage-current conversion circuit 2, the same voltage is applied to the gate electrodes of the third transistor Q3 and the fourth transistor Q4, causing the same current to flow through the third transistor Q3 and the fourth transistor Q4. The current is half of constant current i1 output from the first constant-current power source I1.

Since a current of i½ flows through the third transistor Q3, the same current flows through the fifth transistor Q5, causing a current of i½ to flow through the sixth transistor Q6, which forms the current mirror circuit together with the fifth transistor Q5.

Since the same current flows through the sixth transistor Q6 and the fourth transistor Q4, neither current flows from the output node 2c in the voltage-current conversion circuit 2 to the input node 4a of the first conversion section 4 or the input node 5a of the second conversion section 5 in the signal conversion circuit 3, nor current flows from the input nodes 4a or 5a to the output node 2c.

The output node 5b, which is directly connected to the input node 5a, is in the same state as the node 5a. Since the voltage at the output node 5b is set to the gate-source voltage, $V_{GS2(idle)}$, of the second transistor Q2 at the state in which the specified current, $I_{(idle)}$, flows into the second transistor Q2, the second input node 1b of the output circuit 1 has a voltage of $V_{GS2(idle)}$. This voltage is applied to the gate electrode of the second transistor Q2, the specified current, $I_{(idle)}$, flowing into the second transistor Q2. In this case, since the second transistor Q2 is an n-type MOS transistor, it can operate in a slight conductivity state close to the non-conductivity state (the gate voltage is set to near the threshold voltage of the n-type MOS transistor), and the specified current can be very low current.

A low voltage of $V_{GS2(idle)}$ is applied to the gate electrode of the tenth transistor Q10, a p-type MOS transistor of which the gate electrode is connected to the input node 4a. The specified bias voltage is applied to the gate electrode of the twelfth transistor Q12, which forms a differential pair together with the tenth transistor Q10. Since substantially the same voltage is applied to the gate electrodes of the tenth and twelfth transistors Q10 and Q12 in this case, the magnitude ratio of the current flowing through the tenth transistor Q10 and that flowing through the twelfth transistor Q12 is 1:n.

Because the magnitude ratio of constant current i5 of the fifth constant-current power source I5 and constant current i6 of the sixth constant-current power source I6 is also 1:n, current i5 flows into the tenth transistor Q10 and current i6 flows into the twelfth transistor Q12. No current flows through resistor component R4.

Since constant current i5 flows into the tenth transistor Q10, the same current flows into the eleventh transistor Q11, also flowing the same current into the thirteenth transistor Q13, which forms a current mirror circuit with the eleventh transistor Q11.

Current i5 from the fifth current source flows through load component R1 and the voltage drop across load component R1 is i5×r1. This voltage drop, i5×r1, is set to the same voltage as the gate-source voltage, $V_{GS1(idle)}$, of the first transistor Q1 in the state in which very low current $I_{(idle)}$ flows through the first transistor Q1 under a slight-conductivity state close to non-conductivity state (the gate voltage of the first transistor Q1, a p-type OS transistor, is set to near the threshold voltage of the first transistor Q1).

Therefore, the voltage at the output node 4b has a value obtained by subtracting the product i5×r1 from power voltage $V_{DD}$ applied to the power-voltage node, and the voltage at the first input node 1a in the output circuit 1 is also equal to $V_{DD}$ minus i5 multiplied by r1 (=$V_{GS1(idle)}$)]. As a result, the specified current, $I_{(idle)}$, flows into the first transistor Q1. Since the first transistor Q1 is a p-type MOS transistor, it can operate in a slight conductivity state close to the non-conductivity state, and the specified current can be very low current.

Because the signal conversion circuit 3 operates in the following way, the output nodes 5b and 4b of the signal conversion circuit 3 are maintained to be $V_{GS2(idle)}$ and $V_{DD}-V_{GS1(idle)}$, respectively, when no signal is applied. That is, when the voltage at the output node 2c of the voltage-current conversion circuit 2 becomes higher than $V_{GS2(idle)}$, the voltages at the output nodes 5b and 4b are made higher to increase the conductivity level of the second transistor Q2. This makes the current flowing through Q2 higher than $I_{(idle)}$ and, to reduce the conductivity level of the first transistor Q1, makes the current flowing through Q1 lower than $I_{(idle)}$, thereby the voltage at the output node 1c in the output circuit 1 is reduced. Also, the voltage at the non-inverted-input node 2a of the voltage-current conversion circuit 2 is reduced, and the voltage of the output node 2c of the voltage-current conversion circuit 2 is reduced, keeping the voltages at the output nodes 5b and 4b at $V_{GS2(idle)}$ and $V_{DD}-V_{GS1(idle)}$, respectively. When the voltage at the output node 2c of the voltage-current conversion circuit 2 becomes lower than $V_{GS2(idle)}$, the voltages at the output nodes 5b and 4b are made lower to reduce the conductivity level of the second transistor Q2, causing the current flowing through Q2 to be lower than $I_{(idle)}$ and, to increase the conductivity level of the first transistor Q1, making the current flowing through Q1 higher than $I_{(idle)}$, thereby the voltage at the output node 1c in the output circuit 1 is increased. Also, the voltage at the non-inverted-input node 2a of the voltage-current conversion circuit 2 is increased, and the voltage of the output node 2c of the voltage-current conversion circuit 2 is increased, keeping the voltages at the output nodes 5b and 4b at $V_{GS2(idle)}$ and $V_{DD}-V_{GS1(idle)}$, respectively.

As a result, although very low current $I_{(idle)}$ flows into the first and second transistors Q1 and Q2, which is required to smoothly change the flow of current when the first and second transistors Q1 and Q2 switch between conductivity and non-conductivity states in order to obtain stable output waveform at the output node 1c, neither current flows from the output node 1c of the output circuit 1 to load RL connected to the output terminal OUT nor vice versa.

Operations in a case when an input signal is applied to the inverted-input terminal IN(−) of the op amp will be described next by referring to waveform of the main signals shown in FIGS. 6(a)–6(e) (for convenience, the input signal is assumed to be a sine-wave signal).

The description will be made in a case in which the input signal (shown in FIG. 6(a)) is negative (in the first period shown in FIGS. 6(a)–6(e)) against the bias voltage, $V_{DD}/2$.

When the input signal is negative against $V_{DD}/2$, the voltage at the inverted-input node 2a is lower than that at the non-inverted-input node 2b in the voltage-current conversion circuit 2. According to this voltage difference, since the conductivity level of the third transistor Q3 is higher than that of the fourth transistor Q4, more current flows through the third transistor Q3 than that flowing through the fourth transistor Q4. A current of i½+Δi1 flows into the third transistor Q3, and a current of i½−Δ1 flows into the fourth transistor Q4, where i1 is the current output from the constant-current power source I1 and Δi1 is a current increment increasing or decreasing depending on the voltage difference.

A current of i½+Δi1 flows into the fifth transistor Q5 and a current of i½+Δi1 also flows into the sixth transistor Q6, which forms the current mirror circuit together with the fifth transistor Q5.

A current of i½−Δi1 flows into the fourth transistor Q4 and a current of i½+Δi1 flows into the sixth transistor Q6. Then, a current of 2Δi1 flows into the sixth transistor Q6 from the input node 4a of the first conversion section 4 and the input node 5a of the second conversion section 5 of the signal conversion circuit 3.

The voltage at the input node 4a of the first conversion section 4 and the input node 5a of the second conversion section 5 changes to a level lower than the gate-source voltage, $V_{GS2(idle)}$, obtained when no signal is applied, of the second transistor Q2, according to the current difference 2Δi1. The voltage change at the input node 5a of the second conversion section 5 is the same as that at the output node 5b. The voltage, $V_{GS2}$, applied to the gate electrode of the second transistor Q2 is made lower than $V_{GS2(idle)}$.

The second transistor Q2, an n-type MOS transistor, is in a state which falls in the range from the non-conductivity state to a slight conductivity state close to the non-conductivity state. The current flowing through the second transistor Q2 is set to a value ranging from a level further lower than very low current $I_{(idle)}$ to 0 (see FIG. 6(c)).

A lower voltage than $V_{GS2(idle)}$ is applied to the gate electrode of the tenth transistor Q10, which is connected to the input node 4a at the gate electrode. According to the voltage difference, the conductivity level of the tenth transistor Q10 is higher than that of the twelfth transistor Q12. A current of i5+Δi flows into the tenth transistor Q10, and a current of i6−Δi flows into the twelfth transistor Q12, where Δi1 is a current increment increasing or decreasing depending on the voltage difference. It flows into the tenth transistor Q10 through resistive component R4 from the sixth constant-current power source I6.

Figure 6:
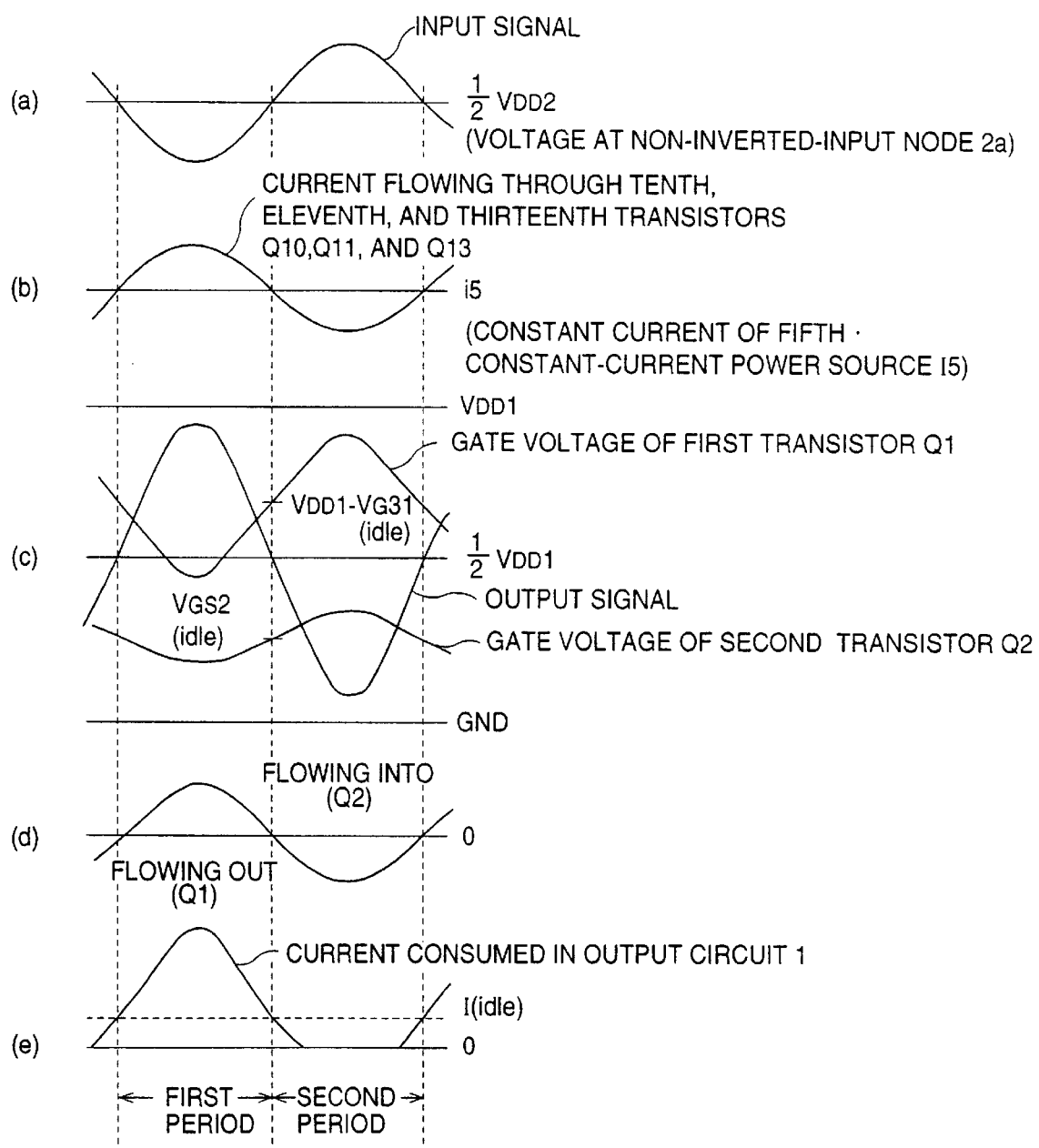
FIGS. 6(a)–6(e) are diagrams showing the waveforms of the main sections in the second embodiment of the present invention.

As a result, a current of i5+Δi flows into the eleventh and thirteenth transistors Q11 and Q13 (see FIG. 6(b)).

Since the current flowing through the thirteenth transistor Q13 is higher than constant current i5 of the fifth constant-current power source I5, the voltage drop across load component R1 becomes large, making the voltage at the first input node 1a of the output circuit 1, that is the gate voltage of the first transistor Q1, lower than $V_{DD}-V_{GS1(idle)}$ (see FIG. 6(c)). The conductivity level of the first transistor Q1, a p-type MOS transistor, becomes high, and the current flowing through the first transistor Q1 becomes higher than $I_{(idle)}$.

Because the current flowing through the first transistor Q1 is higher than $I_{(idle)}$ and the current flowing through the second transistor Q2 is lower than $I_{(idle)}$, current flows from the output node 1c of the output circuit 1 to load RL connected to the output terminal OUT (see FIG. 6(d)).

As a result, the voltage (output signal) at the output node 1c of the output circuit 1 becomes higher than $V_{DD}/2$ (see FIG. 6(c)).

Voltage changes at the first and second input nodes 1a and 1b of the output circuit are negatively fed back to the non-inverted-input node 2a through capacitors C1 and C2 and feedback resistor R3 to stabilize the voltage at the non-inverted-input node 2a.

FIG. 6(e) shows the current consumed in the output circuit 1.

Next, the description will be made in a case in which the input signal (shown in FIG. 6(a)) is positive (in the second period shown in FIGS. 6(a)–(e)) against the bias voltage, $V_{DD2}/2$.

When the input signal is positive against $V_{DD}/2$, the voltage at the inverted-input node 2a is higher than that at the non-inverted-input node 2b in the voltage-current conversion circuit 2. According to this voltage difference, since the conductivity level of the third transistor Q3 is lower than that of the fourth transistor Q4, less current flows through the third transistor Q3 than that flowing through the fourth transistor Q4. A current of i½−Δi1 flows into the third transistor Q3, and a current of i½+Δi1 flows into the fourth transistor Q4, where i1 is the current output from the constant-current power source I1 and Δi1 is a current increment increasing or decreasing depending on the voltage difference.

A current of i½−Δi1 flows into the fifth transistor Q5 and a current of i½−Δi1 also flows into the sixth transistor Q6, which forms the current mirror circuit together with the fifth transistor Q5.

A current of i½+Δi1 flows into the fourth transistor Q4 and a current of i½−Δi1 flows into the sixth transistor Q6. Then, a current of 2Δi1 flows from the fourth transistor Q4 into the input node 4a of the first conversion section 4 and the input node 5a of the second conversion section 5 in the signal conversion circuit 3.

The voltage at the input node 4a of the first conversion section 4 and the input node 5a of the second conversion section 5 changes to a level higher than the gate-source voltage, $V_{GS2(idle)}$, obtained when no signal is applied, of the second transistor Q2, according to the current difference 2Δi1. The voltage change at the input node 5a of the second conversion section 5 is the same as that at the output node 5b. The voltage applied to the gate electrode of the second transistor Q2 is made higher than $V_{GS2(idle)}$.

The second transistor Q2, an n-type MOS transistor, is in a state which has higher conductivity than a slight conductivity state close to the non-conductivity state. The current flowing through the second transistor Q2 is set to a value higher than current $I_{(idle)}$ (see FIG. 6(c)).

A lower voltage than $V_{GS2(idle)}$ is applied to the gate electrode of the tenth transistor Q10, which is connected to the input node 4a at the gate electrode. According to the voltage difference, the conductivity level of the tenth transistor Q10 is lower than that of the twelfth transistor Q12. A current of i5–Δi flows into the tenth transistor Q10, and a current of i6+Δi flows into the twelfth transistor Q12, where Δi1 is a current increment increasing or decreasing depending on the voltage difference. It flows into the twelfth transistor Q12 through resistive component R4 from the fifth constant-current power source I6.

As a result, a current of i5–Δi flows into the eleventh and thirteenth transistors Q11 and Q13 (see FIG. 6(b)).

Since the current flowing through the thirteenth transistor Q13 is lower than constant current i5 of the fifth constant-current power source I5, the voltage drop across load component R1 becomes small, making the voltage at the first input node 1a of the output circuit 1, that is, the gate voltage of the first transistor Q1, higher than $V_{DD}-V_{GS1(idle)}$ (see FIG. 6(c)). The conductivity level of the first transistor Q1, a p-type MOS transistor, becomes low, and the current flowing through the first transistor Q1 becomes lower than $I_{(idle)}$.

Because the current flowing through the first transistor Q1 is lower than $I_{(idle)}$ and the current flowing through the second transistor Q2 is higher than $I_{(idle)}$, current flows from load RL connected to the output terminal OUT through the output node 1c of the output circuit 1 and the output node 1a into the second transistor Q2 (see FIG. 6(d)).

As a result, the voltage (output signal) at the output node 1c of the output circuit 1 becomes lower than $V_{DD}/2$ (see FIG. 6(c)).

Voltage changes at the first and second input nodes 1a and 1b of the output circuit are negatively fed back to the non-inverted-input node 2a through capacitors C1 and C2 and feedback resistor R3 to stabilize the voltage at the non-inverted-input node 2a.

FIG. 6(e) shows the current consumed in the output circuit 1.

An amplifier circuit using the op amp having the structure described above has the same advantages as described in the first embodiment. In addition, since the power-voltage range of the signal conversion circuit 3 is wider than that of the output circuit 1, the gate-voltage amplitudes of the first and second transistors Q1 and Q2 which constitute the output circuit 1 can be set large, and the operation resistance of the first and second transistors Q1 and Q2 can be sufficiently reduced.

Third Embodiment

Figure 7:
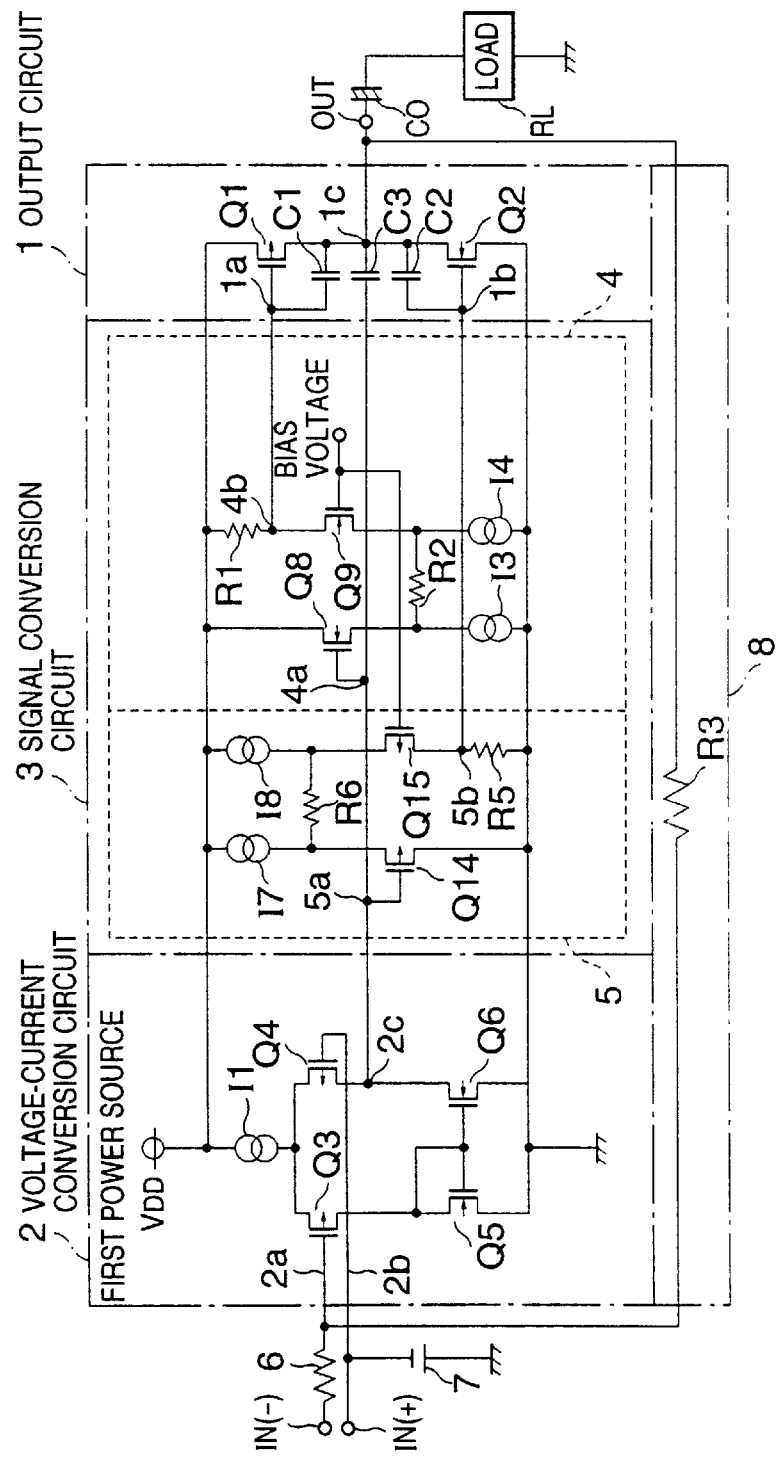
FIG. 7 is a circuit diagram showing a third embodiment of the present invention.

FIG. 7 shows an amplifier circuit using a class-AB CMOS operational amplifier according to a third embodiment of the present invention. The third embodiment differs from the first embodiment, shown in FIGS. 1 and 2, in that the circuit configuration of the signal conversion circuit 3 is different. The other portions are the same.

In FIG. 7, the same symbols as those used in FIGS. 1 and 2 indicate the same or the corresponding portions. A signal conversion circuit 3 controls the gate voltage of the first transistor Q1 in the output circuit 1 with the first specified voltage being used as a reference, and controls the gate voltage of the second transistor Q2 in the output circuit 1 with the second specified voltage, which is lower than the first specified voltage, being used as a reference. In the this embodiment, the first specified voltage is obtained by subtracting the gate-source voltage, $V_{GS1(idle)}$, of the first transistor Q1 in the state when no input signal is applied from the power voltage, $V_{DD1}$, applied to the first power-voltage node. In this embodiment, the second specified voltage is equal to the gate-source voltage, $V_{GS2(idle)}$, of the second transistor Q2 in the state when no signal is applied.

The signal conversion circuit 3 comprises a first conversion section 4 which is the similar to that used in the first embodiment for controlling the gate voltage of the first transistor Q1 in the output circuit 1, and a second conversion section 5 which is different from that used in the first embodiment for controlling the gate voltage of the second transistor Q2 in the output circuit 1.

The first conversion section 4 is the same as that of the first embodiment described above except that the seventh transistor Q7 and the second constant-current power source I2 are removed and the input node 4a connected to the output node 2c of the voltage-current conversion circuit 2 is directly connected to the gate electrode of the eighth transistor Q8.

Since the voltage at the output node 2c of the voltage-current conversion circuit 2 can be set to any value by the second conversion section 5 described in detail below, the bias voltage applied to the gate electrode of the ninth transistor Q9 can be set to any value. In other words, the bias voltage is set to the same value as the voltage at the output node 2c of the voltage-current conversion circuit 2, obtained when no signal is applied. When the voltage at the output node 2c of the voltage-current conversion circuit 2 with no signal being applied, is set to half of the power voltage, $V_{DD}$, applied to the power-voltage node, for example, the bias voltage is set to the same value, $V_{DD}/2$, increasing design margin.

The second conversion section 5 comprises the fourteenth and fifteenth transistors Q14 and Q15, the seventh and eighth constant-current power sources I7 and I8, load component R5 and the resistive component R6.

The fourteenth transistor Q14 is a p-type MOS transistor in which the gate electrode serving as a control electrode is connected to the input node 5a which is connected to the output node 2c of the voltage-current conversion circuit 2 and the drain electrode serving as one main electrode is connected to the ground node.

The seventh constant-current power source I7 supplies constant current i7 by receiving the power voltage, $V_{DD}$, from the power-voltage node. The constant-current supply node is connected to the source electrode serving as one main electrode of the fourteenth transistor Q14.

The fifteenth transistor Q15 is a p-type MOS transistor in which the drain electrode serving as one main electrode is connected to the output node 5b. The output node 5b is connected to the second input node of the output circuit 1, and the specified bias voltage is applied to the gate electrode serving as a control electrode. In this embodiment, the specified bias voltage is the same as the voltage at the output node 2c in the voltage-current conversion circuit 2 with no signal being applied and the same as the bias voltage applied to the gate electrode of the ninth transistor Q9. The fifteenth transistor Q15 has the same channel length as that and the channel width m times that of the fourteenth transistor Q14, where "m" represents a certain ratio of the width $W_{Q14}$ of the fourteenth transistor Q14 to the width $W_{Q15}$ of the fifteenth transistor Q15, i.e., $W_{Q14}/W_{Q15}=1/n$. They form a differential pair of transistors.

The eighth constant-current power source I8 supplies constant current i8 by receiving the power voltage, $V_{DD}$, from the power-voltage node. The constant-current supply node is connected to the source electrode serving as one main electrode of the fifteenth transistor Q15. The eighth constant-current power source I8 is formed such that constant current i8 has a relationship of 1:m (=i7:i8) with constant current i7 flowing through the constant-current power source I7.

Load component R5 is a resistive component connected between the ground node and the output node 5b.

The resistive component R6 is connected between one main electrode of the fourteenth transistor Q14 and one main electrode of the fifteenth transistor Q15.

Resistance r5 of the load component R5 is specified such that the product of r5 and i8 equals the gate-source voltage, $V_{GS2(idle)}$, of the second transistor Q2 with no signal being applied.

A third capacitive component C3, such as a MOS capacitor, is connected between the output node 2c of the voltage-current conversion circuit 2 and the output node 1c of the output circuit 1. It is used for eliminating a phase shift between the output node 2c of the voltage-current conversion circuit 2 and the output node 1c of the output circuit 1.

Operations in the amplifier circuit using the op amp configured as above will be described next.

First, operations performed when no signal is applied will be described.

Since the same voltage, $V_{DD}/2$, is applied to the inverted-input node 2a and the non-inverted-input node 2b of the voltage-current conversion circuit 2, the same voltage is applied to the gate electrodes of the third transistor Q3 and the fourth transistor Q4, causing the same current to flow through the third transistor Q3 and the fourth transistor Q4. The current is half of constant current i1 output from the first constant-current power source I1.

Since a current of i½ flows through the third transistor Q3, the same current flows through the fifth transistor Q5, making a current of i½ flow through the sixth transistor Q6, which forms the current mirror circuit together with the fifth transistor Q5.

Since the same current flows through the sixth transistor Q6 and the fourth transistor Q4, neither current flows from the output node 2c in the voltage-current conversion circuit 2 to the input node 4a of the first conversion section 4 or the input node 5a of the second conversion section 5 in the signal conversion circuit 3, nor current flows from the input nodes 4a or 5a to the output node 2c.

Herein, the voltage at the output node 2c of the voltage-current conversion circuit 2 in this case is set such that it equals the bias voltage applied to the gate electrodes of the ninth and fifteenth transistors Q9 and Q15.

Since the gate voltage of the fourteenth transistor Q14 is the same as that of the fifteenth transistor Q15, therefore, both of which form a differential pair of transistors in the second conversion section 5, the ratio of the amount of current flowing through the fourteenth transistor Q14 to that of current flowing through the fifteenth transistor Q15 is 1:m.

Because the magnitude ratio of constant current i7 of the seventh constant-current power source I7 and constant current i8 of the eighth constant-current power source I8 is also 1:m, current i7 flows into the fourteenth transistor Q14 and current i8 flows into the fifteenth transistor Q15. No current flows through resistive component R6.

Current i8 flows through load component R5 and the voltage drop across load component R5 is i8×r5. Since this voltage drop, i8×r5, is set to the gate-source voltage, $V_{GS2(idle)}$, of the second transistor Q2 at the state in which the specified current, $I_{(idle)}$, flows into the second transistor Q2, the voltage applied to the gate electrode of the second transistor Q2 is $V_{GS2(idle)}$ (=i8×r5). The specified current, $I_{(idle)}$, flows into the second transistor Q2. In this case, since the second transistor Q2 is an n-type MOS transistor, it can operate in a slight conductivity state close to the non-conductivity state (the gate voltage is set to near the threshold voltage of the n-type MOS transistor), and the specified current can be very low current.

Since the gate voltage of the eighth transistor Q8 is the same as that of the ninth transistor Q9, both of which form a differential pair of transistors in the first conversion section 4, the ratio of the amount of current flowing through the eighth transistor Q8 to that of current flowing through the ninth transistor Q9 is 1:n.

Because the magnitude ratio of constant current i3 of the third constant-current power source I3 and constant current i4 of the fourth constant-current power source I4 is also 1:n, current i3 flows into the eighth transistor Q8 and current i4 flows into the ninth transistor Q9. No current flows through resistor component R2.

Current i4 flows through load component R1 and the voltage drop across load component R1 is i4×r1. This voltage drop, i4×r1, is set to the same voltage as the gate-source voltage, $V_{GS1(idle)}$, of the first transistor Q1 in the state in which very low current, $I_{(idle)}$, flows through the first transistor Q1 under a slight-conductivity state close to non-conductivity state (the gate voltage of the first transistor Q1, a p-type MOS transistor, is set to near the threshold voltage of the first transistor Q1).

Therefore, the voltage at the output node 4b is becomes a value obtained by subtracting i4×r1 from power voltage $V_{DD}$ applied to the power-voltage node, and the voltage at the first input node 1a in the output circuit 1 is equal to $V_{DD}$ minus i4 multiplied by r1 (=$V_{GS1(idle)}$). As a result, the specified current, $I_{(idle)}$, flows into the first transistor Q1. Since the first transistor Q1 is a p-type MOS transistor, it can operate in a slight conductivity state close to the non-conductivity state, and the specified current can be very low current.

Because the signal conversion circuit 3 operates in the following way, the output nodes 5b and 4b of the signal conversion circuit 3 are maintained to be $V_{GS2(idle)}$ and $V_{DD}$-$V_{GS1(idle)}$, respectively, when no signal is applied. When the voltage at the output node 2c of the voltage-current conversion circuit 2 becomes higher than $V_{GS2(idle)}$, the voltages at the output nodes 5b and 4b are made higher to increase the conductivity level of the second transistor Q2, making the current flowing through Q2 higher than $I_{(idle)}$, and to reduce the conductivity level of the first transistor Q1, making the current flowing through Q1 lower than $I_{(idle)}$, thereby the voltage at the output node 1c in the output circuit 1 is reduced, the voltage at the non-invertedinput node 2a of the voltage-current conversion circuit 2 is reduced, and the voltage of the output node 2c of the voltage-current conversion circuit 2 is reduced, keeping the voltages at the output nodes 5b and 4b at $V_{GS2(idle)}$ and $V_{DD}-V_{GS1(idle)}$, respectively. When the voltage at the output node 2c of the voltage-current conversion circuit 2 becomes lower than $V_{GS2(idle)}$, the voltages at the output nodes 5b and 4b are made lower to reduce the conductivity level of the second transistor Q2, making the current flowing through Q2 lower than $I_{(idle)}$, and to increase the conductivity level of the first transistor Q1, making the current flowing through Q1 higher than $I_{(idle)}$, thereby the voltage at the output node 1c in the output circuit 1 is increased, the voltage at the non-inverted-input node 2a of the voltage-current conversion circuit 2 is increased, and the voltage of the output node 2c of the voltage-current conversion circuit 2 is increased, keeping the voltages at the output nodes 5b and 4b at $V_{GS2(idle)}$ and $V_{DD}-V_{GS1(idle)}$, respectively.

As a result, although very low current $I_{(idle)}$ flows into the first and second transistors Q1 and Q2, which is required to smoothly change the flow of current when the first and second transistors Q1 and Q2 switch between conductivity and non-conductivity states in order to obtain stable output waveform at the output node 1c, current does not flow from the output node 1c of the output circuit 1 to load RL connected to the output terminal OUT or vice versa.

Operations in a case when an input signal is applied to the inverted-input terminal IN(−) of the op amp will be described next assuming that the input signal is a sine-wave signal.

The description will be made in a case in which the input signal is negative against the bias voltage, $V_{DD}/2$.

When the input signal is negative against $V_{DD}/2$, the voltage at the inverted-input node 2a is lower than that at the non-inverted-input node 2b in the voltage-current conversion circuit 2. According to this voltage difference, since the conductivity level of the third transistor Q3 is higher than that of the fourth transistor Q4, more current flows through the third transistor Q3 than flows through the fourth transistor Q4. A current of i½+Δi1 flows into the third transistor Q3, and a current of i½−Δi1 flows into the fourth transistor Q4, where i1 is the current output from the first constant-current power source I1 and Δi1 is a current increment increasing or decreasing depending on the voltage difference.

A current of i½+Δi1 flows into the fifth transistor Q5 and a current of i½+Δi1 also flows into the sixth transistor Q6, which forms the current mirror circuit together with the fifth transistor Q5.

A current of i½−Δi1 flows into the fourth transistor Q4 and a current of i½+Δi1 flows into the sixth transistor Q6. Then, a current of 2Δi1 flows into the sixth transistor Q6 from the input node 4a of the first conversion section 4 and the input node 5a of the second conversion section 5 of the signal conversion circuit 3.

The voltage at the input node 4a of the first conversion section 4 and the input node 5a of the second conversion section 5 changes to a level lower than the bias voltage (in the third embodiment, $V_{DD}/2$) applied to the ninth and fifteenth transistors Q9 and Q15 according to the current difference 2Δi1.

Since a voltage lower than $V_{DD}/2$ is applied to the gate electrode of the fourteenth transistor Q14, which is connected to the input node 5a at its gate electrode, the conductivity level of the fourteenth transistor Q14 is higher than that of the fifteenth transistor Q15 according to this voltage difference. A current of i7+Δi flows into the fourteenth transistor Q14, and a current of i8−Δi flows into the fifteenth transistor Q15, where Δi is a current increment increasing or decreasing depending on the voltage difference and flows into the fourteenth transistor Q14 through resistive component R6 from the eighth constant-current power source I8.

Since the current flowing through the fifteenth transistor Q15 becomes lower than constant current i8 of the eighth constant-current power source I8, the voltage drop across load component R5 is reduced. As a result, the voltage at the second input node 1b of the output circuit 1, namely, the gate voltage, $V_{GS2}$, of the second transistor Q2 is lower than $V_{GS2(idle)}$. The second transistor Q2, an n-type MOS transistor, is in a state which falls in the range from the non-conductivity state to a slight conductivity state close to the non-conductivity state. The current flowing through the second transistor Q2 is set to a value ranging from a level further lower than very low current $I_{(idle)}$ to 0.

A lower voltage than $V_{DD}/2$ is applied to the gate electrode of the eighth transistor Q8, which is connected to the input node 4a at the gate electrode. According to the voltage difference, the conductivity level of the eighth transistor Q8 is lower than that of the ninth transistor Q9. A current of i3−Δi flows into the eighth transistor Q8, and a current of i4+Δi flows into the ninth transistor Q9, where Δi1 is a current increment increasing or decreasing depending on the voltage difference and flows into the third constant-current power source I3 through resistive component R2 from the ninth transistor Q9.

Since the current flowing through the ninth transistor Q9 is higher than constant current i4 of the fourth constant-current power source I4, the voltage drop across load component R1 becomes large, making the voltage at the first input node 1a of the output circuit 1, that is, the gate voltage of the first transistor Q1, lower than $V_{DD}-V_{GS1(idle)}$. The conductivity level of the first transistor Q1, a p-type MOS transistor, becomes high, and the current flowing through the first transistor Q1 becomes higher than $I_{(idle)}$.

Because the current flowing through the first transistor Q1 is higher than $I_{(idle)}$ and the current flowing through the second transistor Q2 is lower than $I_{(idle)}$, current flows from the output node 1c of the output circuit 1 to load RL connected to the output terminal OUT.

As a result, the voltage (output signal) at the output node 1c of the output circuit 1 becomes higher than $V_{DD}/2$.

Voltage changes at the first and second input nodes 1a and 1b of the output circuit 1 and a voltage change at the output node 2c of the voltage-current conversion circuit 2 are negatively fed back to the non-inverted-input node 2a through capacitors C1, C2, and C3 and feedback resistor R3 to stabilize the voltage at the non-inverted-input node 2a.

Next, the description will be made in a case in which the input signal is positive against the bias voltage, $V_{DD}/2$.

When the input signal is positive against $V_{DD}/2$, the voltage at the inverted-input node 2a is higher than that at the non-inverted-input node 2b in the voltage-current conversion circuit 2. According to this voltage difference, since the conductivity level of the third transistor Q3 is lower than that of the fourth transistor Q4, less current flows through the third transistor Q3 than that flowing through the fourth transistor Q4. A current of i½−Δi1 flows into the third transistor Q3, and a current of i½+Δi1 flows into the fourth transistor Q4, where i1 is the current output from the first constant-current power source I1 and Δi1 is a current increment increasing or decreasing depending on the voltage difference.

A current of i½−Δi1 flows into the fifth transistor Q5 and a current of i½−Δi1 also flows into the sixth transistor Q6, which forms the current mirror circuit together with the fifth transistor Q5.

A current of i½+Δi1 flows into the fourth transistor Q4 and a current of i½−Δi1 flows into the sixth transistor Q6. Then, a current of 2Δi1 flows from the fourth transistor Q4 into the input node 4a of the first conversion section 4 and the input node 5a of the second conversion section 5 in the signal conversion circuit 3.

The voltage at the input node 4a of the first conversion section 4 and the input node 5a of the second conversion section 5 changes to a level higher than the bias voltage (in the third embodiment, $V_{DD}/2$) applied to the ninth and fifteenth transistors Q9 and Q15 according to the current difference 2Δi1.

Since a voltage higher than $V_{DD}/2$ is applied to the gate electrode of the fourteenth transistor Q14, which is connected to the input node 5a at its gate electrode, the conductivity level of the fourteenth transistor Q14 is lower than that of the fifteenth transistor Q15 according to this voltage difference. A current of i7−Δi flows into the fourteenth transistor Q14, and a current of i8+Δi flows into the fifteenth transistor Q15, where Δi is a current increment increasing or decreasing depending on the voltage difference and flows into the fifteenth transistor Q15 through resistive component R6 from the seventh constant-current power source I7.

Since the current flowing through the fifteenth transistor Q15 becomes higher than constant current i8 of the eighth constant-current power source I8, the voltage drop across load component R5 is increased. As a result, the voltage, $V_{GS2}$, applied to the gate electrode of the second transistor Q2 is higher than $V_{GS2(idle)}$.

The second transistor Q2, an n-type MOS transistor, is in a conductivity state having a higher conductivity than a slight conductivity state close to the non-conductivity state. The current flowing through the second transistor Q2 is set to a value higher than $I_{(idle)}$.

A higher voltage than the bias voltage (in the third embodiment, $V_{DD}/2$) applied to the ninth transistor Q9 is applied to the gate electrode of the eighth transistor Q8, which is connected to the input node 4a at its gate electrode. According to the voltage difference, the conductivity level of the eighth transistor Q8 is higher than that of the ninth transistor Q9. A current of i3+Δi flows into the eighth transistor Q8, and a current of i4−Δi flows into the ninth transistor Q9, where Δi1 is a current increment increasing or decreasing depending on the voltage difference and flows into the fourth constant-current power source I4 through resistive component R2 from the eighth transistor Q8.

Since the current flowing through the ninth transistor Q9 is lower than constant current i4 of the fourth constant-current power source I4, the voltage drop across load component R1 becomes small, making the voltage at the first input node 1a of the output circuit 1, that is, the gate voltage of the first transistor Q1, higher than $V_{DD}-V_{GS1(idle)}$. The conductivity level of the first transistor Q1, a p-type MOS transistor, becomes low, and the current flowing through the first transistor Q1 becomes lower than $I_{(idle)}$.

Because the current flowing through the first transistor Q1 is lower than $I_{(idle)}$ and the current flowing through the second transistor Q2 is higher than $I_{(idle)}$, current flows from load RL connected to the output terminal OUT through the output node 1c of the output circuit 1 and the output node 1a to the second transistor Q2.

As a result, the voltage (output signal) at the output node 1c of the output circuit 1 becomes lower than $V_{DD}/2$.

Voltage changes at the first and second input nodes 1a and 1b of the output circuit 1 and a voltage change at the output node 2c of the voltage-current conversion circuit 2 are negatively fed back to the non-inverted-input node 2a through capacitors C1, C2, and C3 and feedback resistor R3 to stabilize the voltage at the non-inverted-input node 2a.

An amplifier circuit using the op amp configured as described above has the same advantages as the first embodiment. In addition, design margin is increased because the voltage at the output node 2c of the voltage-current conversion circuit 2 with no signal being applied and the bias voltage in the first and second conversion sections 4 and 5 of the signal conversion circuit 2 can be set as desired.

Fourth Embodiment

Figure 8:
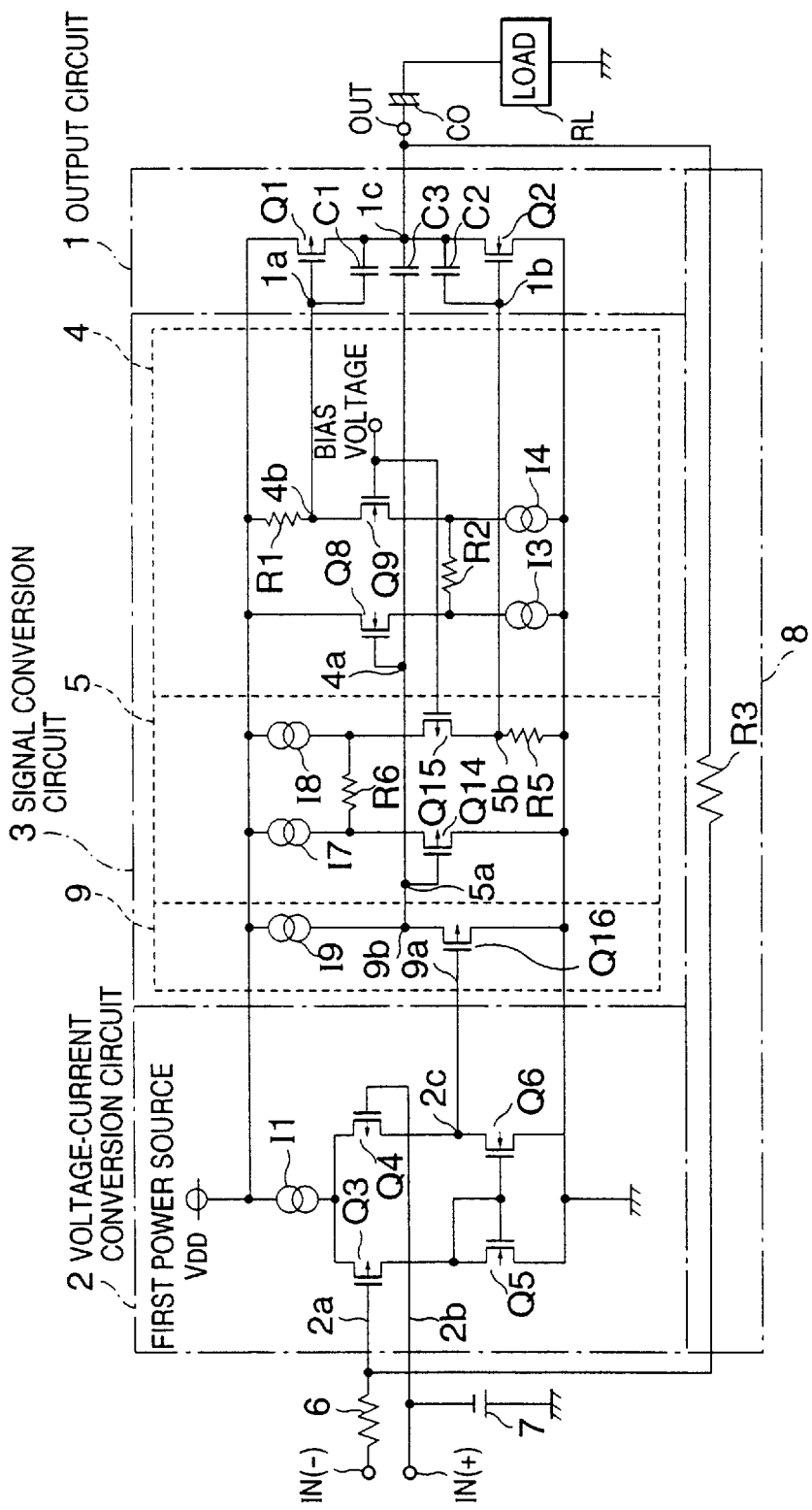
FIG. 8 is a circuit diagram showing a fourth embodiment of the present invention.

FIG. 8 shows an amplifier circuit using a class-AB CMOS operational amplifier (hereinafter called op amp) according to a fourth embodiment of the present invention. The fourth embodiment is the same as the third embodiment, shown in FIG. 7, except that a signal conversion circuit 3 is provided with a level-shift section 9. The level-shift section 9 comprises a level-shift circuit disposed between the output node 2c of the voltage-current conversion circuit 2 and the input nodes 4a and 5a of the first and second conversion sections 4 and 5.

In FIG. 8, the same symbols as those used in FIG. 7 represent the same or corresponding portions. In the level-shift section 9, the input node is connected to the output node 2c of the voltage-current conversion circuit 2 and the output node is connected to the input nodes 4a and 5a of the first and second conversion sections 4 and 5. The level shift section 9 in the signal conversion circuit 3 shifts the voltage appearing at the output node 2c of the voltage-current conversion circuit 2, in this embodiment increases the voltage in proportion, and applies it to the input nodes 4a and 5a of the first and second conversion sections 4 and 5. The level-shift section 9 comprises, e.g., a sixteenth transistor which is a p-type MOS transistor in which the gate electrode serving as a control electrode is connected to the input node 9a, the source electrode serving as one main electrode is connected to the output node, and the drain electrode serving as the other main electrode is connected to the ground-voltage node, and a ninth constant-current power source I9 for supplying constant current i9 by receiving the power voltage, $V_{DD}$, from the power-voltage node. The constant-current supply node is connected to the source electrode of the sixteenth transistor Q16.

The voltage appearing at the output node of the level-shift section 9 when no signal is applied is specified such that it equals the bias voltage applied to the ninth and fifteenth transistors Q9 and Q15 in the first and second conversion sections.

Operations in an amplifier circuit using the op amp configured as described above are the same as those in the third embodiment except that the level-shift section 9 in the signal conversion circuit 3 shifts the voltage appearing at the output node 2c of the voltage-current conversion circuit 2 and applies it to the input nodes 4a and 5a of the first and second conversion sections 4 and 5.

Therefore, the amplifier circuit using the op amp configured as described above has the same advantages as the third embodiment. In addition, it can increase the voltage at the input nodes 4a and 5a of the first and second conversion sections 4 and 5 in the signal conversion circuit 2 with the use of the level shift section 9 even when the voltage at the output node 2c of the voltage-current conversion circuit 2 with no signal being applied cannot be increased due to circuit design restrictions, and can precisely control the gate voltages of the first and second transistors Q1 and Q2 of the output circuit 1.

Fifth Embodiment

Figure 9:
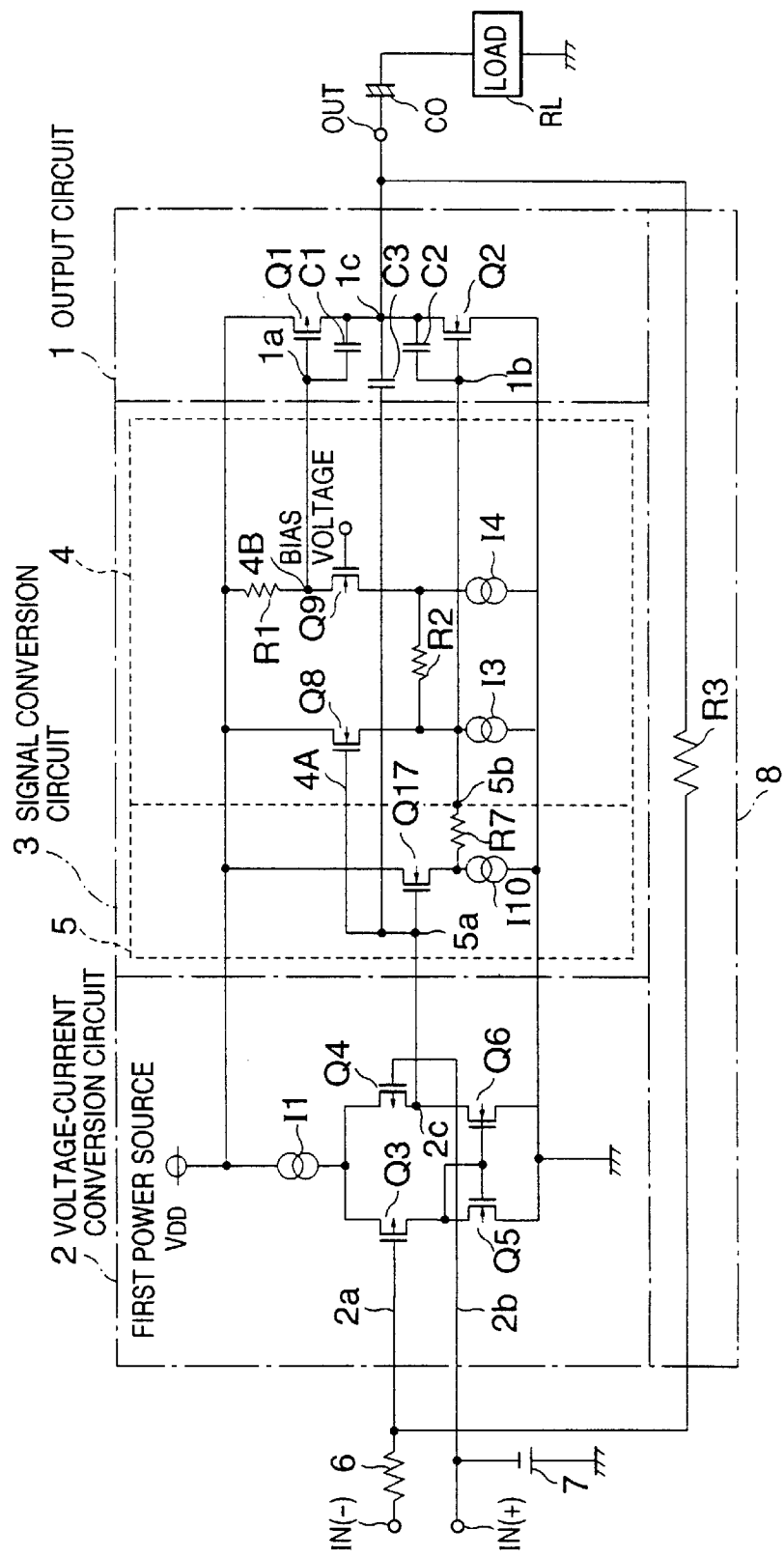
FIG. 9 is a circuit diagram showing a fifth embodiment of the present invention.

FIG. 9 shows an amplifier circuit using a class-AB CMOS operational amplifier (hereinafter called op amp) according to a fifth embodiment of the present invention. The fifth embodiment is the same as the first embodiment, shown in FIGS. 1 and 2, except that the configuration of the signal conversion circuit 3 is different.

In FIG. 9, the same symbols as those used in FIGS. 1 and 2 indicate the same or the corresponding portions. The first conversion section 4 of the signal conversion circuit 3 is the same as that of the first embodiment described above except that the seventh transistor Q7 and the second constant-current power source I2 are removed and the input node 4a connected to the output node 2c of the voltage-current conversion circuit 2 is directly connected to the gate electrode of the eighth transistor Q8.

Since the voltage at the output node of the voltage-current conversion circuit 2 with no signal being applied can be set to any value by the second conversion section 5 described in detail below, the bias voltage applied to the ninth transistor Q9 can be set to any value. When the voltage at the output node 2c of the voltage-current conversion circuit 2 with no signal being applied, is set to half of the power voltage, $V_{DD}$, applied to the power-voltage node, for example, the bias voltage is set to the same value, $V_{DD}/2$.

The second conversion section 5 comprises the seventeenth transistor Q17, the tenth constant-current power source I10, and the resistive component R7.

The seventeenth transistor Q17 is an n-type MOS transistor in which the gate electrode serving as a control electrode is connected to the input node 5a and the drain electrode serving as one main electrode is connected to the ground node in this exemplary embodiment. The input node 5a is connected to the output node 2c of the voltage-current conversion circuit 2.

In the tenth constant-current power source I10, a constant-current drawing node is connected to the source electrode serving as one main electrode of the seventeenth transistor Q17. Constant current i10 is drawn from the constant-current drawing node to the ground-voltage node.

The resistive component R7 is connected between the source electrode of the seventeenth transistor Q17 and the second input node 1b of the output circuit 1.

When the voltage appearing at the output node 2a of the voltage-current conversion circuit 2 with no signal being applied is applied to the gate electrode of a seventeenth transistor Q17, the transistor has a specified conductivity level, and the same current flow as constant current i10 flowing through the tenth constant-current power source I10. Current does not flow from or into the output node 5b, and the voltage at the output node 5b becomes the gate-source voltage, $V_{GS2(idle)}$, which is the voltage obtained when the specified current, $I_{(idle)}$, flows through the second transistor Q2. When a voltage higher than that obtained when no signal is applied is applied to the gate electrode of the seventeenth transistor Q17, the transistor has a higher conductivity level than the specified conductivity level, higher current than i10 flows through resistive component R7 from the output node 5b to the second input node 1b of the output circuit 1, and the voltage at the output node 5b becomes a voltage lower than $V_{GS2(idle)}$. When a voltage lower than that obtained when no signal is applied is applied to the gate electrode of the seventeenth transistor Q17, the transistor has a lower conductivity level than the specified conductivity level, lower current than i10 flows from the second input node 1b of the output circuit 1 through the output node 5b and resistive component R7 to constant-current power source I10 to make the voltage at the output node 5b to a voltage higher than $V_{GS2(idle)}$.

Operations in the amplifier circuit using the op amp configured as described above will be described next.

First, operations performed when no signal is applied will be described.

Since the same voltage, $V_{DD}/2$, is applied to the inverted-input node 2a and the non-inverted-input node 2b of the voltage-current conversion circuit 2, the same voltage is applied to the gate electrodes of the third transistor Q3 and the fourth transistor Q4, causing the same current to flow through the third transistor Q3 and the fourth transistor Q4. The current is half of constant current i1 output from the first constant-current power source I1.

Since a current of i½ flows through the third transistor Q3, the same current flows through the fifth transistor Q5, making a current of i½ flow through the sixth transistor Q6, which forms the current mirror circuit together with the fifth transistor Q5.

Since the same current flows through the sixth transistor Q6 and the fourth transistor Q4, neither current flows from the output node 2c in the voltage-current conversion circuit 2 to the input node 4a of the first conversion section 4 or the input node 5a of the second conversion section 5 in the signal conversion circuit 3, nor current flows from the input nodes 4a or 5a to the output node 2c.

Therefore, the voltage at the output node 2c of the voltage-current conversion circuit 2 becomes the same voltage as the gate voltage of the seventeenth transistor Q17 obtained when it has the conductivity level at which i10 flows and the bias voltage applied to the ninth transistor Q17, that is, $V_{DD}/2$ in the fifth embodiment The seventeenth transistor Q17 in the second conversion section 5 becomes a conductivity state with the specified conductivity level, and a current of i10 flows Since this current is the same as constant current i10 flowing through the tenth constant-current power source I10, current does not flow from or into the output node 5b, and the voltage at the output node 5b is the same as the gate-source voltage, $V_{GS2(idle)}$, of the second transistor Q2 obtained when the specified current, $I_{(idle)}$, flows through the second transistor Q2.

As a result, the voltage applied to the gate electrode of the second transistor Q2 is $V_{GS2(idle)}$ and the specified current, $I_{(idle)}$, flows into the second transistor Q2. In this case, since the second transistor Q2 is an n-type MOS transistor, it can operate in a slight conductivity state close to the non-conductivity state (the gate voltage is set to near the threshold voltage of the n-type MOS transistor), and the specified current can be very low current Since the gate voltage of the eighth transistor Q8 is the same as that of the ninth transistor Q9, both of which form a differential pair of transistors in the first conversion section 4, the ratio of the amount of current flowing through the eighth transistor Q8 to that of current flowing through the ninth transistor Q9 is 1:n.

Because the magnitude ratio of constant current i3 of the third constant-current power source I3 and constant current i4 of the fourth constant-current power source I4 is also 1:n, current i3 flows into the eighth transistor Q8 and current i4 flows into the ninth transistor Q9. No current flows through resistor component R2.

Current i4 flows through load component R1 and the voltage drop across load component R1 is i4×r1. This voltage drop, i4×r1, is set to the same voltage as the gate-source voltage, $V_{GS1(idle)}$, of the first transistor Q1 in the state in which very low current, $I_{(idle)}$, flows through the first transistor Q1 under a slight-conductivity state close to non-conductivity state (the gate voltage of the first transistor Q1, a p-type MOS transistor, is set to near the threshold voltage of the first transistor Q1).

Therefore, the voltage at the output node 4b is becoming to a value obtained by subtracting i4×r1 from power voltage $V_{DD}$ applied to the power-voltage node, and the voltage at the first input node 1a in the output circuit 1 is equal to $V_{DD}$ minus i4 multiplied by r1 ($=V_{GS1(idle)}$)]. As a result, the specified current, $I_{(idle)}$, flows into the first transistor Q1. Since the first transistor Q1 is a p-type MOS transistor, it can operate in a slight conductivity state close to the non-conductivity state, and the specified current can be very low current.

Because the signal conversion circuit 3 operates in the following way, the output nodes 5b and 4b of the signal conversion circuit 3 are maintained to be $V_{GS2(idle)}$ and $V_{DD}-V_{GS1(idle)}$, respectively, when no signal is applied. When the voltage at the output node 2c of the voltage-current conversion circuit 2 becomes higher than $V_{GS2(idle)}$, the voltages at the output nodes 5b and 4b are made higher to increase the conductivity level of the second transistor Q2, making the current flowing through Q2 higher than $I_{(idle)}$, and to reduce the conductivity level of the first transistor Q1, making the current flowing through Q1 lower than $I_{(idle)}$, thereby the voltage at the output node 1c in the output circuit 1 is reduced, the voltage at the non-inverted-input node 2a of the voltage-current conversion circuit 2 is reduced, and the voltage of the output node 2c of the voltage-current conversion circuit 2 is reduced, keeping the voltages at the output nodes 5b and 4b at $V_{GS2(idle)}$ and $V_{DD}-V_{GS1(idle)}$, respectively When the voltage at the output node 2c of the voltage-current conversion circuit 2 becomes lower than $V_{GS2(idle)}$, the voltages at the output nodes 5b and 4b are made lower to reduce the conductivity level of the second transistor Q2, making the current flowing through Q2 lower than $I_{(idle)}$, and to increase the conductivity level of the first transistor Q1, making the current flowing through Q1 higher than $I_{(idle)}$, thereby the voltage at the output node 1c in the output circuit 1 is increased, the voltage at the non-inverted-input node 2a of the voltage-current conversion circuit 2 is increased, and the voltage of the output node 2c of the voltage-current conversion circuit 2 is increased, keeping the voltages at the output nodes 5b and 4b at $V_{GS2(idle)}$ and $V_{DD}-V_{GS1(idle)}$, respectively.

As a result, although very low current $I_{(idle)}$ flows into the first and second transistors Q1 and Q2, which is required to smoothly change the flow of current when the first and second transistors Q1 and Q2 switch between conductivity and non-conductivity states in order to obtain stable output waveform at the output node 1c, current does not flow from the output node 1c of the output circuit 1 to load RL connected to the output terminal OUT or vice versa Operations in a case when an input signal is applied to the inverted-input terminal IN(−) of the op amp will be described next, with the assumption that the input signal is a sine-wave signal.

The description will be made in a case in which the input signal is negative against the bias voltage, $V_{DD}/2$.

When the input signal is negative against $V_{DD}/2$, the voltage at the inverted-input node 2a is lower than that at the non-inverted-input node 2b in the voltage-current conversion circuit 2. According to this voltage difference, since the conductivity level of the third transistor Q3 is higher than that of the fourth transistor Q4, more current flows through the third transistor Q3 than that flowing through the fourth transistor Q4. A current of i½+Δi1 flows into the third transistor Q3, and a current of i½−Δi1 flows into the fourth transistor Q4, where i1 is the current output from the first constant-current power source I1 and Δi1 is a current increment increasing or decreasing depending on the voltage difference.

A current of i½+Δi1 flows into the fifth transistor Q5 and a current of i½+Δi1 also flows into the sixth transistor Q6, which forms the current mirror circuit together with the fifth transistor Q5.

A current of i½−Δi1 flows into the fourth transistor Q4 and a current of i½+Δi1 flows into the sixth transistor Q6. Then, a current of 2Δi1 flows into the sixth transistor Q6 from the input node 4a of the first conversion section 4 and the input node 5a of the second conversion section 5 of the signal conversion circuit 3

The voltage at the input node 4a of the first conversion section 4 and the input node 5a of the second conversion section 5 changes to a level lower than the bias voltage (in the fifth embodiment, $V_{DD}/2$) applied to the ninth transistor Q9 according to the current difference 2Δi1 so as to reduce the conductivity level of the seventeenth transistor Q17.

Since a voltage lower than the voltage obtained when no signal is applied is applied to the gate electrode of the seventeenth transistor Q17, which is connected to the input node 5a at its gate electrode, the conductivity level of the seventeenth transistor Q17 becomes lower according to the applied voltage. Since the conductivity level of the seventeenth transistor Q17 becomes lower, the current flowing through the seventeenth transistor Q17 becomes lower than the current i1 from the tenth constant current source I10.

As a result, current flows from the second input node 1b of the output circuit 1 through the output node 5b and resistive component R7 to the tenth constant-current power source I10, the voltage at the output node 5b becomes lower, and the voltage at the second input node 1b of the output circuit 1, that is, the gate voltage, $V_{GS2}$, of the second transistor Q2, becomes lower than $V_{GS2(idle)}$.

The second transistor Q2, an n-type MOS transistor, is in a state which falls in the range from the non-conductivity state to a slight conductivity state close to the non-conductivity state. The current flowing through the second transistor Q2 is set to a value ranging from a level further lower than very low current $I_{(idle)}$ to 0.

A lower voltage than $V_{DD}/2$ is applied to the gate electrode of the eighth transistor Q8, which is connected to the input node 4a at the gate electrode. According to the voltage difference, the conductivity level of the eighth transistor Q8 is lower than that of the ninth transistor Q9. A current of i3−Δi flows into the eighth transistor Q8, and a current of i4+Δi flows into the ninth transistor Q9, where Δi1 is a current increment increasing or decreasing depending on the voltage difference and flows into the third constant-current power source I3 through resistive component R2 from the ninth transistor Q9.

Since the current flowing through the ninth transistor Q9 is higher than constant current i4 of the fourth constant-current power source I4, the voltage drop across load component R1 becomes large, making the voltage at the first input node 1a of the output circuit 1, that is, the gate voltage of the first transistor Q1, lower than $V_{DD}-V_{GS1(idle)}$. The conductivity level of the first transistor Q1, a p-type MOS transistor, becomes high, and the current flowing through the first transistor Q1 becomes higher than $I_{(idle)}$.

Because the current flowing through the first transistor Q1 is higher than $I_{(idle)}$ and the current flowing through the second transistor Q2 is lower than $I_{(idle)}$, current flows from the output node 1c of the output circuit 1 to load RL connected to the output terminal OUT.

As a result, the voltage (output signal) at the output node 1c of the output circuit 1 becomes higher than $V_{DD}/2$.

Voltage changes at the first and second input nodes 1a and 1b of the output circuit 1 and a voltage change at the output node 2c of the voltage-current conversion circuit 2 are negatively fed back to the non-inverted-input node 2a through capacitors C1, C2, and C3 and feedback resistor R3 to stabilize the voltage at the non-inverted-input node 2a.

Next, the description will be made in a case in which the input signal is positive against the bias voltage, $V_{DD}/2$.

When the input signal is positive against $V_{DD}/2$, the voltage at the inverted-input node 2a is higher than that at the non-inverted-input node 2b in the voltage-current conversion circuit 2. According to this voltage difference, since the conductivity level of the third transistor Q3 is lower than that of the fourth transistor Q4, less current flows through the third transistor Q3 than flows through the fourth transistor Q4. A current of i½−Δi1 flows into the third transistor Q3, and a current of i½+Δi1 flows into the fourth transistor Q4, where i1 is the current output from the first constant-current power source I1 and Δi1 is a current increment increasing or decreasing depending on the voltage difference.

A current of i½−Δi1 flows into the fifth transistor Q5 and a current of i½−Δi1 also flows into the sixth transistor Q6, which forms the current mirror circuit together with the fifth transistor Q5.

A current of i½+Δi1 flows into the fourth transistor Q4 and a current of i½−Δi1 flows into the sixth transistor Q6. Then, a current of 2Δi1 flows from the fourth transistor Q4 into the input node 4a of the first conversion section 4 and the input node 5a of the second conversion section 5 in the signal conversion circuit 3.

The voltage at the input node 4a of the first conversion section 4 and the input node 5a of the second conversion section 5 changes to a level higher than the bias voltage (in the fifth embodiment, $V_{DD}/2$) applied to the ninth transistor Q9 according to the current difference 2Δi1 so as to increase the conductivity level of the seventeenth transistor Q17.

Since a voltage higher than the voltage obtained when no signal is applied is applied to the gate electrode of the seventeenth transistor Q17, which is connected to the input node 5a at its gate electrode, the conductivity level of the seventeenth transistor Q17 becomes higher according to the applied voltage. Since the conductivity level of the seventeenth transistor Q17 becomes higher, the current flowing through the seventeenth transistor Q17 becomes higher than current i10 from the tenth constant-current source I10.

As a result, current flows from the seventeenth transistor Q17 to the second input node 1b of the output circuit 1 through the output node 5b and resistive component R7, the voltage at the output node 5b becomes higher, and the voltage at the second input node 1b of the output circuit 1, that is, the gate voltage, $V_{GS2}$, of the second transistor Q2, becomes higher than $V_{GS2(idle)}$.

Therefore, the second transistor Q2, an n-type MOS transistor, enters a conductivity state having a higher conductivity level than a slight conductivity state close to the non-conductivity state. The current flowing through the second transistor Q2 is set to a value higher than $I_{(idle)}$.

A higher voltage than the bias voltage (in the fifth embodiment, $V_{DD}/2$) applied to the ninth transistor Q9 is applied to the gate electrode of the eighth transistor Q8, which is connected to the input node 4a at the gate electrode. According to the voltage difference, the conductivity level of the eighth transistor Q8 is higher than that of the ninth transistor Q9. A current of i3+Δi flows into the eighth transistor Q8, and a current of i4−Δi flows into the ninth transistor Q9, where Δi1 is a current increment increasing or decreasing depending on the voltage difference and flows into the fourth constant-current power source I4 through resistive component R2 from the eighth transistor Q8.

Since the current flowing through the ninth transistor Q9 is lower than constant current i4 of the fourth constant-current power source I4, the voltage drop across load component R1 becomes small, making the voltage at the first input node 1a of the output circuit 1, that is, the gate voltage of the first transistor Q1, higher than $V_{DD}-V_{GS1(idle)}$. The conductivity level of the first transistor Q1, a p-type MOS transistor, becomes low, and the current flowing through the first transistor Q1 becomes lower than $I_{(idle)}$.

Because the current flowing through the first transistor Q1 is lower than $I_{(idle)}$ and the current flowing through the second transistor Q2 is higher than $I_{(idle)}$, current flows from load RL connected to the output terminal OUT through the output node 1c of the output circuit 1 and the output node 1a to the second transistor Q2.

As a result, the voltage (output signal) at the output node 1c of the output circuit 1 becomes lower than $V_{DD}/2$.

Voltage changes at the first and second input nodes 1a and 1b of the output circuit 1 and a voltage change at the output node 2c of the voltage-current conversion circuit 2 are negatively fed back to the non-inverted-input node 2a through capacitors C1, C2, and C3 and feedback resistor R3 to stabilize the voltage at the non-inverted-input node 2a.

An amplifier circuit using the op amp configured as described above has the same advantages as the first embodiment. In addition, design margin is increased because the voltage at the output node 2c of the voltage-current conversion circuit 2 with no signal being applied and the bias voltage in the first and second conversion sections 4 and 5 of the signal conversion circuit 2 can be set as desired.

Sixth Embodiment

Figure 10:
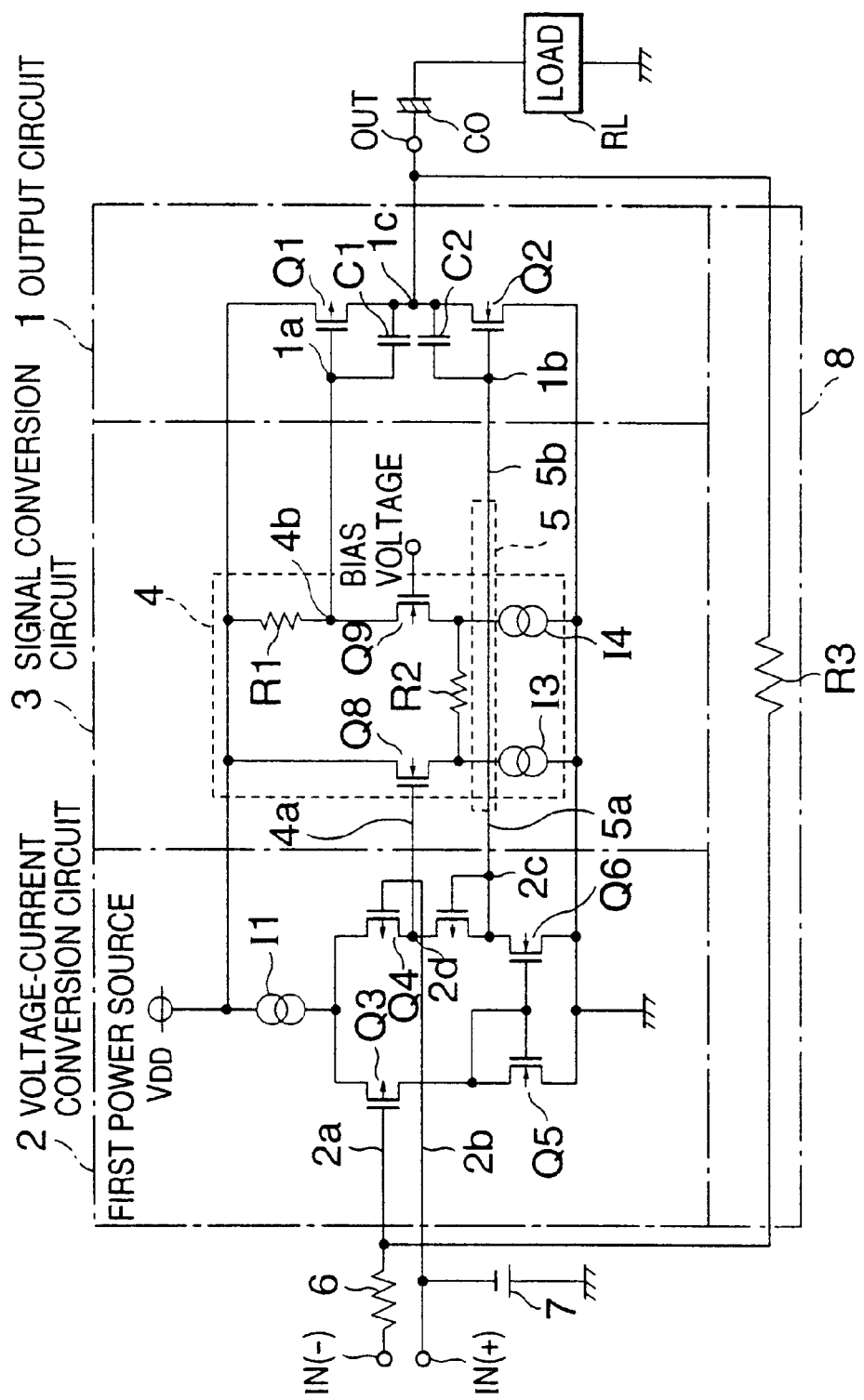
FIG. 10 is a circuit diagram showing a sixth embodiment of the present invention.

FIG. 10 shows an amplifier circuit using a class-AB CMOS operational amplifier according to a sixth embodiment of the present invention. The sixth embodiment is the same as the first embodiment, shown in FIGS. 1 and 2, except that the configurations of a voltage-current conversion circuit 2 and a signal conversion circuit 3 are slightly different In FIG. 10, the same symbols as those used in FIGS. 1 and 2 represent the same or corresponding portions. A voltage-current conversion circuit 2 is the same as that used in the first embodiment except that a voltage-shift means for applying a voltage shifted from that of the output node (hereinafter called the first output node) 2c is connected between the first output node 2c and the second output node 2d. The first output node 2c is connected to the drain electrode of the sixth transistor Q6. The second node 2d is connected to the drain electrode of the fourth transistor Q4. In other words, the voltage shift means is between the drain electrode of the sixth transistor Q6 and the drain electrode of the fourth transistor Q4. The voltage shift is a second voltage which is different from a first voltage appearing at the first output node 2c and which changes in phase with respect to the first voltage and is applied to the second output node 2d.

This voltage-shift means comprises a p-type MOS transistor Q18 (hereinafter called the eighteenth transistor) in which the source electrode is connected to the second output node 2d and the drain and gate electrodes are connected to the first output node 2c in common.

The first conversion section 4 of the signal conversion circuit 3 is the same as that of the first embodiment described above except that the seventh transistor Q7 and the second constant-current power source 12 are removed, the input node 4a is directly connected to the gate electrode of the eighth transistor Q8, and the input node 4a is also connected to the output node 2c of the voltage-current conversion circuit 2.

The bias voltage applied to the ninth transistor Q9 is set to the same voltage as that of the second output node 2d in the voltage-current conversion circuit 2 obtained when no signal is applied, that is, the voltage ($V_{GS2(idle)}$) at the first output node 2c in the voltage-current conversion circuit 2 plus the source-drain voltage, $V_{GS}$ (voltage drop as a diode), of the eighteenth transistor Q18.

A second conversion section 5 is the same as that used in the first embodiment. The input node 5a is connected to the first output node 2c of the voltage-current conversion circuit 2.

Operations in the amplifier circuit using the op amp configured as described above will be described next.

First, operations performed when no signal is applied will be described. Since the same voltage, $V_{DD}/2$, is applied to the inverted-input node 2a and the non-inverted-input node 2b of the voltage-current conversion circuit 2, the same voltage is applied to the gate electrodes of the third transistor Q3 and the fourth transistor Q4, making the same current flowing through the third transistor Q3 and the fourth transistor Q4. The current is half of constant current i1 output from the first constant-current power source I1.

Since a current of i½ flows through the third transistor Q3, the same current flows through the fifth transistor Q5, making a current of i½ flow through the sixth transistor Q6, which forms the current mirror circuit together with the fifth transistor Q5.

Since the same current flows through the sixth transistor Q6 and the fourth transistor Q4, neither current flows from the first output node 2c in the voltage-current conversion circuit 2 to the input node 4a of the first conversion section 4 or the input node 5a of the second conversion section 5 in the signal conversion circuit 3, nor current flows from the input nodes 4a or 5a to the first output node 2c.

Therefore, the voltage at the first output node 2c of the voltage-current conversion circuit 2 is set to a specified voltage, that is, the same voltage as the gate-source voltage, $V_{GS2(idle)}$, of the second transistor Q2 obtained when the specified current, $I_{(idle)}$, flows into the second transistor Q2. The voltage at the second output node 2c of the voltage-current conversion circuit 2 is set to $V_{GS2(idle)}$ plus $V_{GS}$.

As a result, the voltage applied to the gate electrode of the second transistor Q2 is $V_{GS2(idle)}$ and the specified current, $I_{(idle)}$, flows into the second transistor Q2. In this case, since the second transistor Q2 is an n-type MOS transistor, it can operate in a slight conductivity state close to the non-conductivity state (the gate voltage is set to near the threshold voltage of the n-type MOS transistor), and the specified current can be very low current.

Since the gate voltage of the eighth transistor Q8 is the same as that of the ninth transistor Q9, both of which form a differential pair of transistors in the first conversion section 4, the ratio of the amount of current flowing through the eighth transistor Q8 to that of current flowing through the ninth transistor Q9 is 1:n.

Because the magnitude ratio of constant current i3 of the third constant-current power source I3 and constant current i4 of the fourth constant-current power source I4 is also 1:n, current i3 flows into the eighth transistor Q8 and current i4 flows into the ninth transistor Q9. No current flows through resistor component R2.

Current i4 from the fourth constant-current source I4 flows through load component R1 and the voltage drop across load component R1 is i4×r1. This voltage drop, i4×r1, is set to the same voltage as the gate-source voltage, $V_{GS1(idle)}$, of the first transistor Q1 in the state in which very low current, $I_{(idle)}$, flows through the first transistor Q1 under a slight-conductivity state close to non-conductivity state (the gate voltage of the first transistor Q1, a p-type NOS transistor, is set to near the threshold voltage of the first transistor Q1).

Therefore, the voltage at the output node 4b is equal to power voltage $V_{DD}$ applied to the power-voltage node—i4×r1], and the voltage at the first input node 1a in the output circuit 1 is equal to $V_{DD}$ minus i4 multiplied by r1 (=$V_{GS1(idle)}$). As a result, the specified current, $I_{(idle)}$, flows into the first transistor Q1. Since the first transistor Q1 is a p-type MOS transistor, it can operate in a slight conductivity state close to the non-conductivity state, and the specified current can be very low current.

Because the signal conversion circuit 3 operates in the following way, the output nodes 5b and 4b of the signal conversion circuit 3 are maintained to be $V_{GS2(idle)}$ and $V_{DD}-V_{GS1(idle)}$, respectively, when no signal is applied. When the voltage at the output node 2c of the voltage-current conversion circuit 2 becomes higher than $V_{GS2(idle)}$, the voltages at the output nodes 5b and 4b are made higher to increase the conductivity level of the second transistor Q2, making the current flowing through Q2 higher than $I_{(idle)}$, and to reduce the conductivity level of the first transistor Q1. Also, this causes the current flowing through the first transistor Q1 to be lower than $I_{(idle)}$, thereby the voltage at the output node 1c in the output circuit 1 is reduced, the voltage at the non-inverted-input node 2a of the voltage-current conversion circuit 2 is reduced, and the voltage of the output node 2c of the voltage-current conversion circuit 2 is reduced, keeping the voltages at the output nodes 5b and 4b at $V_{GS2(idle)}$ and $V_{DD}-V_{GS1(idle)}$, respectively. When the voltage at the output node 2c of the voltage-current conversion circuit 2 becomes lower than $V_{GS2(idle)}$, the voltages at the output nodes 5b and 4b are made lower to reduce the conductivity level of the second transistor Q2. This makes the current flowing through the second transistor Q2 lower than $I_{(idle)}$, and increases the conductivity level of the first transistor Q1, making the current flowing through the first transistor Q1 higher than $I_{(idle)}$, thereby the voltage at the output node 1c in the output circuit 1 is increased, the voltage at the non-inverted-input node 2a of the voltage-current conversion circuit 2 is increased, and the voltage at the output node 2c of the voltage-current conversion circuit 2 is increased, keeping the voltages at the output nodes 5b and 4b at $V_{GS2(idle)}$ and $V_{DD}-V_{GS1(idle)}$, respectively.

As a result, although very low current $I_{(idle)}$ flows into the first and second transistors Q1 and Q2, which is required to smoothly change the flow of current when the first and second transistors Q1 and Q2 switch between conductivity and non-conductivity states in order to obtain stable output waveform at the output node 1c, neither current flows from the output node 1c of the output circuit 1 to load RL connected to the output terminal OUT nor vice versa.

Operations in a case when an input signal is applied to the inverted-input terminal IN(−) of the op amp will be described next assuming that the input signal is a sine-wave signal, by referring to the waveform of the main sections, shown in FIGS. 11(a)–11(e).

The description will be made in a case in which the input signal is negative against the bias voltage, $V_{DD}/2$ (in the first period in FIGS. 11(a)–11(e)).

When the input signal is negative against $V_{DD}/2$, the voltage at the inverted-input node 2a is lower than that at the non-inverted-input node 2b in the voltage-current conversion circuit 2. According to this voltage difference, since the conductivity level of the third transistor Q3 is higher than that of the fourth transistor Q4, more current flows through the third transistor Q3 than that flowing through the fourth transistor Q4. A current of i½+Δi1 flows into the third transistor Q3, and a current of i½−Δi1 flows into the fourth transistor Q4, where i1 is the current output from the first constant-current power source I1 and Δi1 is a current increment increasing or decreasing depending on the voltage difference.

A current of i½+Δi1 flows into the fifth transistor Q5 and a current of i½+Δi1 also flows into the sixth transistor Q6, which forms the current mirror circuit together with the fifth transistor Q5.

A current of i½−Δi1 flows into the fourth transistor Q4 and a current of i½+Δi1 flows into the sixth transistor Q6. Then, a current of 2Δi1 flows into the sixth transistor Q6 from the input node 5a of the second conversion section 5 of the signal conversion circuit 3.

Figure 11:
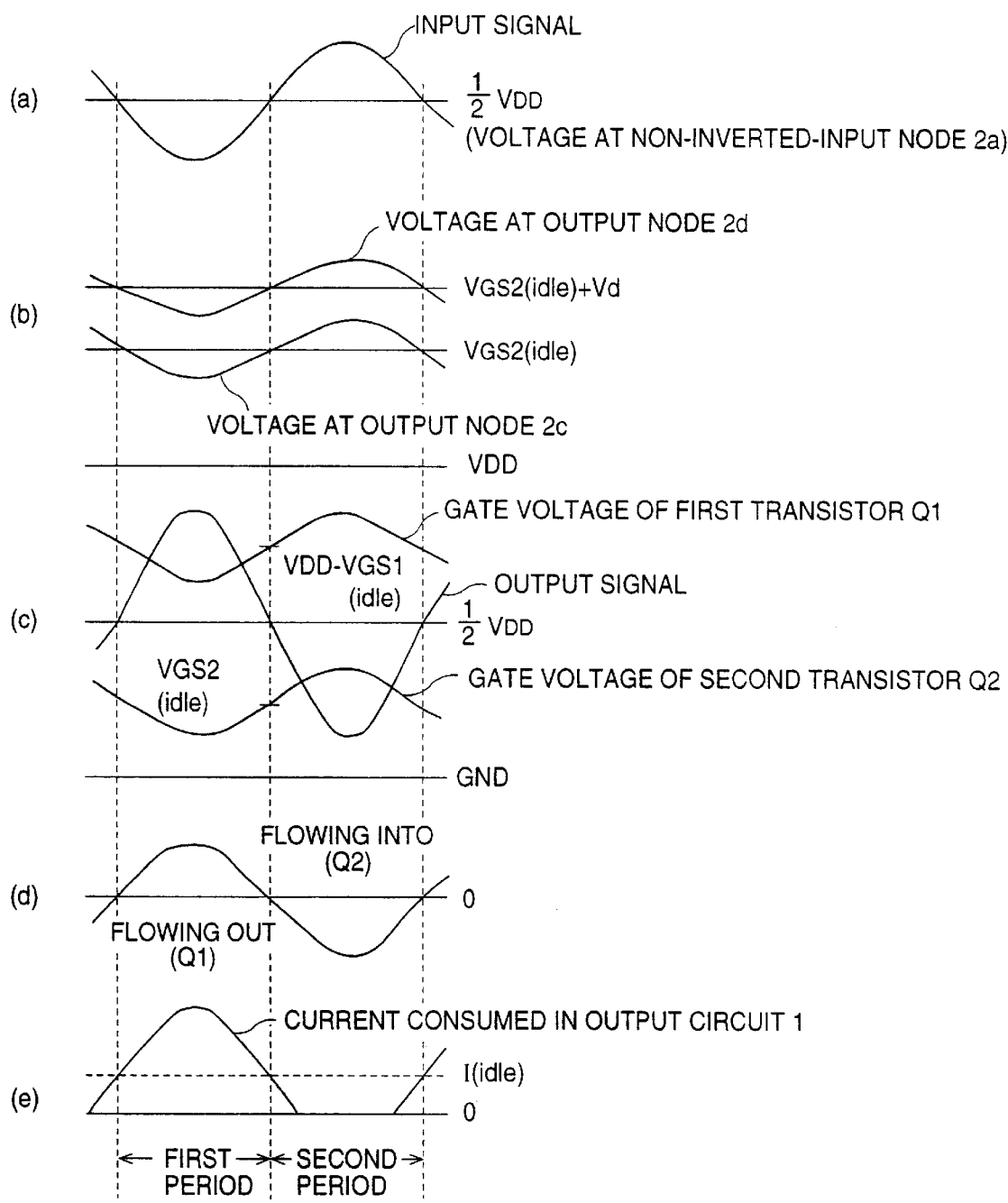
FIGS. 11(a)–11(e) are diagrams showing the waveforms of the main sections in the sixth embodiment of the present invention.

Therefore, the voltage at the first output node 2c of the voltage-conversion circuit 2 changes according to the current difference, 2Δi1, with a reference of $V_{GS2(idle)}$, as shown in FIG. 11(b). The voltage at the second output node 2d of the voltage-conversion circuit 2 changes according to the current difference, 2Δi1, with a reference of $V_{GS2(idle)}$ plus $V_{GS}$, as shown in FIG. 11(b).

The voltage, $V_{GS2}$, of the gate electrode of the second transistor Q2, which is directly connected to the first output node 2c through the second conversion section 5, changes, namely lowers, according to the current difference, 2Δi1, with a reference of $V_{GS2(idle)}$, as shown in FIG. 11(c).

The second transistor Q2, an n-type MOS transistor, is in a state which falls in the range from the non-conductivity state to a slight conductivity state close to the non-conductivity state. The current flowing through the second transistor Q2 is set to a value ranging from a level lower than very low current $I_{(idle)}$ to 0.

Since a lower voltage than $V_{GS2(idle)}+V_{GS}$ is applied to the gate electrode, according to the current difference, 2Δi1, of the eighth transistor Q8, which is connected to the input node 4a connected to the second output node 2d of the voltage-current conversion circuit 2, at the gate electrode, the conductivity level of the eighth transistor Q8 is lower than that of the ninth transistor Q9 according to the voltage difference between the voltage applied to the gate electrode of the eighth transistor Q8 and $V_{GS2(idle)}+V_{GS}$, which is applied to the gate electrode of the ninth transistor Q9. A current of i3−Δi flows into the eighth transistor Q8, and a current of i4+Δi flows into the ninth transistor Q9, where Δi1 is a current increment increasing or decreasing depending on the voltage difference and flows into the third constant-current power source I3 through resistive component R2 from the ninth transistor Q9.

Since the current flowing through the ninth transistor Q9 is higher than constant current i4 of the fourth constant-current power source I4, the voltage drop across load component R1 becomes large, making the voltage at the first input node 1a of the output circuit 1, that is, the gate voltage of the first transistor Q1, lower than $V_{DD}-V_{GS1(idle)}$, as shown in FIG. 11(c). The conductivity level of the first transistor Q1, a p-type MOS transistor, becomes high, and the current flowing through the first transistor Q1 becomes higher than $I_{(idle)}$.

Because the current flowing through the first transistor Q1 is higher than $I_{(idle)}$ and the current flowing through the second transistor Q2 is lower than $I_{(idle)}$, current flows from the output node 1c of the output circuit 1 to load RL connected to the output terminal OUT.

As a result, the voltage (output signal) at the output node 1c of the output circuit 1 becomes higher than $V_{DD}/2$, as shown in FIG. 11(c).

Voltage changes at the first and second input nodes 1a and 1b of the output circuit 1 are negatively fed back to the non-inverted-input node 2a through capacitors C1 and C2 and feedback resistor R3 to stabilize the voltage at the non-inverted-input node 2a.

Next, the description will be made in a case in which the input signal (see FIG. 11(a)) is positive against the bias voltage, $V_{DD}/2$ (in the second period shown in FIGS. 11(a)–(e)).

When the input signal is positive against $V_{DD}/2$, the voltage at the inverted-input node 2a is higher than that at the non-inverted-input node 2b in the voltage-current conversion circuit 2. According to this voltage difference, since the conductivity level of the third transistor Q3 is lower than that of the fourth transistor Q4, less current flows through the third transistor Q3 than that flowing through the fourth transistor Q4. A current of i½−Δi1 flows into the third transistor Q3, and a current of i½+Δi1 flows into the fourth transistor Q4, where i1 is the current output from the first constant-current power source I1 and Δi1 is a current increment increasing or decreasing depending on the voltage difference.

A current of i½−Δi1 flows into the fifth transistor Q5 and a current of i½−Δi1 also flows into the sixth transistor Q6, which forms the current mirror circuit together with the fifth transistor Q5.

A current of i½+Δi1 flows into the fourth transistor Q4 and a current of i½−Δi1 flows into the sixth transistor Q6. Then, a current of 2Δi1 flows from the fourth transistor Q4 through the eighteenth transistor Q18 into the input node 5a of the second conversion section 5 in the signal conversion circuit 3.

Therefore, the voltage at the first output node 2c of the voltage-conversion circuit 2 changes according to the current difference, 2Δi1, with a reference of $V_{GS2(idle)}$, as shown in FIG. 11(b). The voltage at the second output node 2d of the voltage-conversion circuit 2 changes according to the current difference, 2Δi1, with a reference of $V_{GS2(idle)}$ plus $V_{GS}$, as shown in FIG. 11(b).

The voltage of the gate electrode of the second transistor Q2, which is directly connected to the first output node 2c through the second conversion section 5, changes, namely increases, according to the current difference, 2Δi1, with a reference of $V_{GS2(idle)}$, as shown in FIG. 11(c).

The second transistor Q2, an n-type MOS transistor, enters a conductivity state having a higher conductivity level than a slight conductivity state close to the non-conductivity state. The current flowing through the second transistor Q2 is set to a value higher than $I_{(idle)}$.

Since a higher voltage than $V_{GS2(idle)}+V_{GS}$ is applied to the gate electrode, according to the current difference, 2Δi1, of the eighth transistor Q8, which is connected to the input node 4a connected to the second output node 2d of the voltage-current conversion circuit 2, at the gate electrode, the conductivity level of the eighth transistor Q8 is higher than that of the ninth transistor Q9 according to the voltage difference between the voltage applied to the gate electrode of the eighth transistor Q8 and $V_{GS2(idle)}+V_{GS}$, which is applied to the gate electrode of the ninth transistor Q9. A current of i3+Δ1 flows into the eighth transistor Q8, and a current of i4−Δi flows into the ninth transistor Q9, where Δi1 is a current increment increasing or decreasing depending on the voltage difference and flows into the fourth constant-current power source I4 through resistive component R2 from the eighth transistor Q8.

Since the current flowing through the ninth transistor Q9 is lower than constant current i4 of the fourth constant-current power source I4, the voltage drop across load component R1 becomes small, making the voltage at the first input node 1a of the output circuit 1, that is, the gate voltage, $V_{GS1}$, of the first transistor Q1, higher than $V_{DD}-V_{GS1(idle)}$. The conductivity level of the first transistor Q1, a p-type MOS transistor, becomes low, and the current flowing through the first transistor Q1 becomes lower than $I_{(idle)}$.

Because the current flowing through the first transistor Q1 is lower than $I_{(idle)}$ and the current flowing through the second transistor Q2 is higher than $I_{(idle)}$, current flows from load RL connected to the output terminal OUT through the output node 1c of the output circuit 1 and the output node 1a to the second transistor Q2.

As a result, the voltage (output signal) at the output node 1c of the output circuit 1 becomes lower than $V_{DD}/2$, as shown in FIG. 11(c).

Voltage changes at the first and second input nodes 1a and 1b of the output circuit 1 and a voltage change at the output node 2c of the voltage-current conversion circuit 2 are negatively fed back to the non-inverted-input node 2a through capacitors C1, C2, and C3 and feedback resistor R3 to stabilize the voltage at the non-inverted-input node 2a.

Therefore, the amplifier circuit using the op amp configured as described above has the same advantages as the first embodiment. In addition, it can increase the bias voltage of the first conversion section 4 in the signal conversion circuit 2 with a simple circuit configuration because the eighteenth transistor Q18 shifts the voltage at the first output node 2c of the voltage-current conversion circuit 2 and applies it to the input node 4a of the first conversion section 4 in the signal conversion circuit 2 when no signal is applied. Further, by connecting in series a plurality of transistors which are the same as the eighteenth transistor Q18 which constitute the voltage-shift means, the bias voltage of the first conversion section 4 in the signal conversion circuit 2 can be set as desired.

Seventh Embodiment

Figure 12:
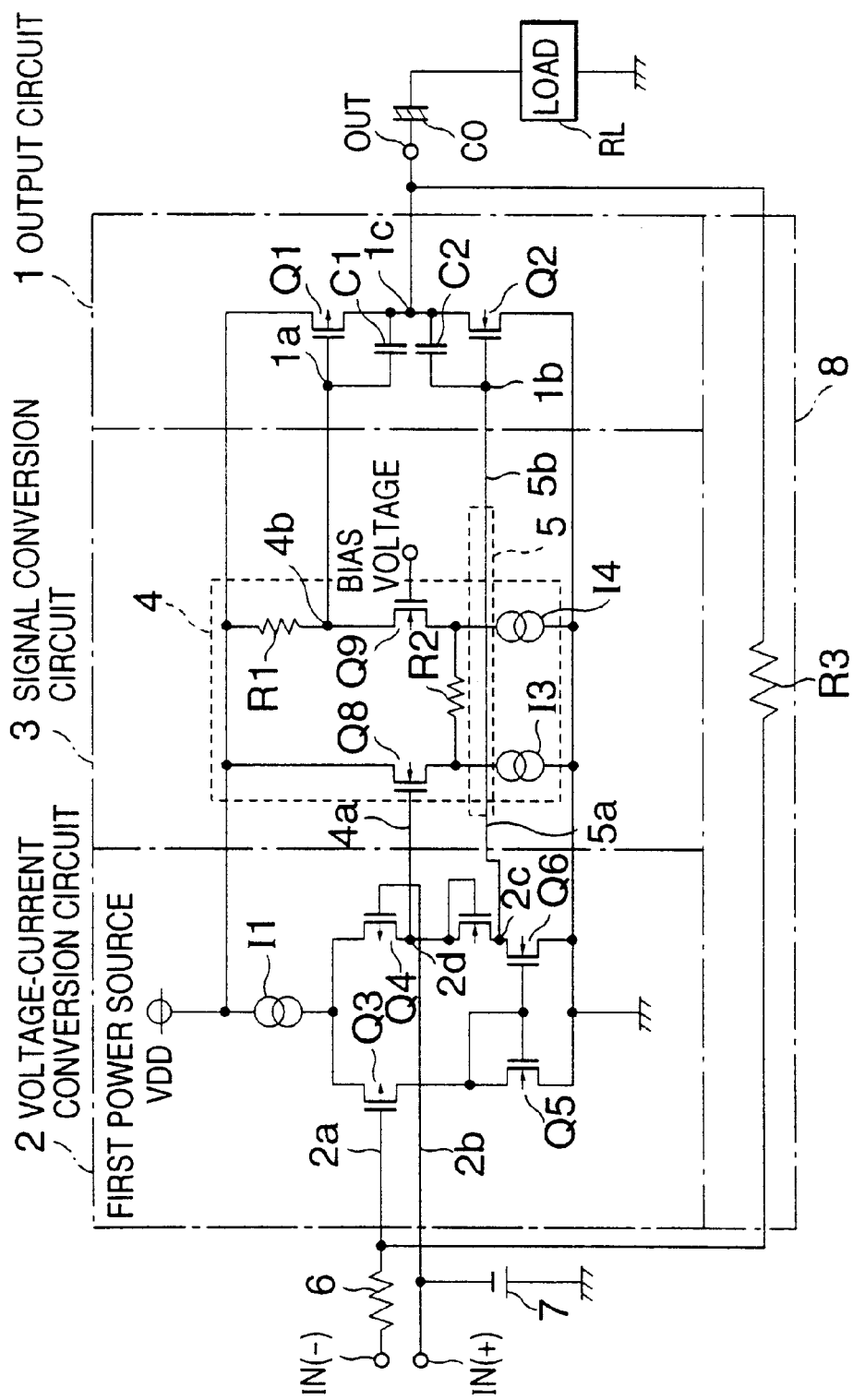
FIG. 12 is a circuit diagram showing a seventh embodiment of the present invention.

FIG. 12 shows an amplifier circuit using a class-AB CMOS operational amplifier according to a seventh embodiment of the present invention. The seventh embodiment is the same as the sixth embodiment, shown in FIG. 10, except that voltage-shift means comprises an N-type MOS transistor Q18 whereas, in the sixth embodiment, the voltage-shift means comprises the p-type MOS transistor Q18.

Figure 13:
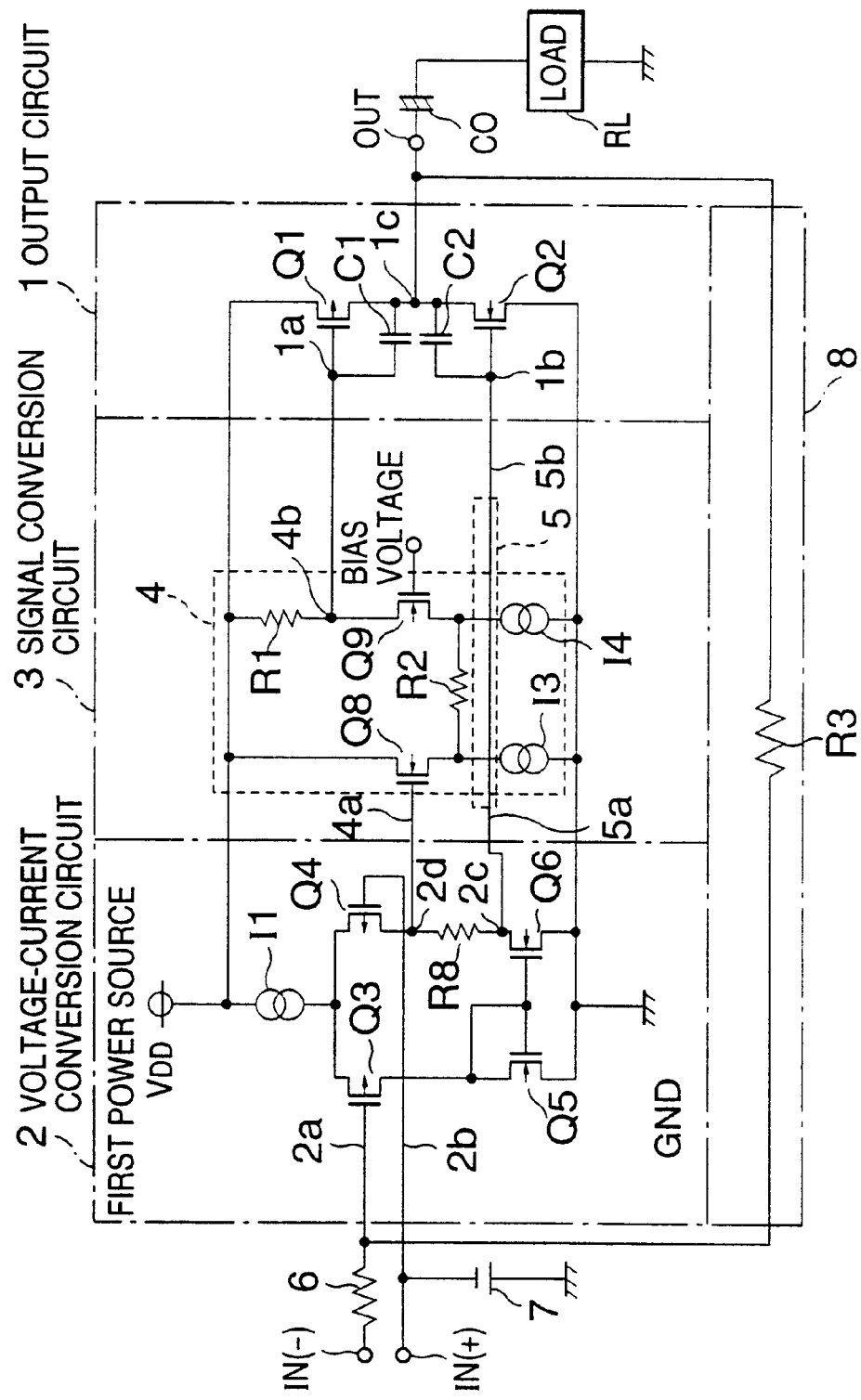
FIG. 13 is a circuit diagram showing an eighth embodiment of the present invention.

The seventh embodiment configured as described above has the same advantages as the sixth embodiment Eighth Embodiment FIG. 13 shows an amplifier circuit according to an eighth embodiment of the present invention. The eighth embodiment is the same as the sixth embodiment, shown in FIG. 10, except that voltage-shift means comprises, for example, a resistive component R8 formed by a polysilicon layer whereas, in the sixth embodiment, the voltage-shift means comprises the p-type MOS transistor Q18.

The seventh embodiment configured as described above has the same advantages as the sixth embodiment.

Ninth Embodiment

Figure 14:
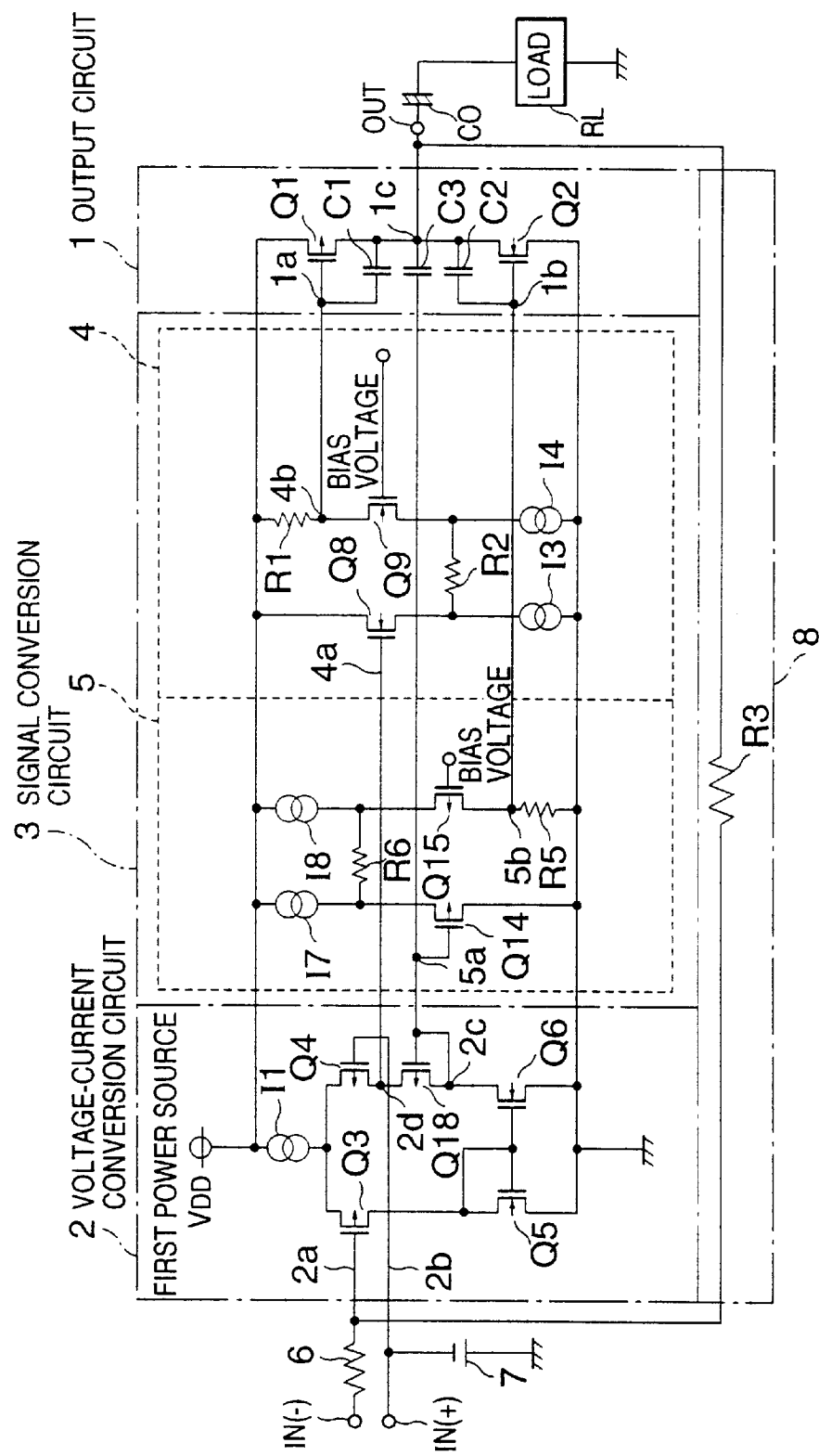
FIG. 14 is a circuit diagram showing a ninth embodiment of the present invention.

FIG. 14 shows an amplifier circuit according to a ninth embodiment of the present invention. The ninth embodiment is the same as the third embodiment, shown in FIG. 7, except that the voltage-current conversion circuit 2 having the first and second output nodes 2c and 2d which is used in the sixth embodiment, shown in FIG. 10, is used as a voltage-current conversion circuit 2 in the ninth embodiment.

In FIG. 14, the same symbols as those used in FIGS. 7 and 10 represent the same or corresponding portions. A voltage-current conversion circuit 2 is the same as that used in the sixth embodiment, shown in FIG. 10, except that voltage-shift means for applying a voltage shifted from that of the output node (hereinafter called the first output node) 2c is connected between the first output node 2c and the second output node 2d, that is, between the drain electrode of the sixth transistor Q6 and the drain electrode of the fourth transistor Q4. In other words, the first input node 2c is connected to the drain electrode of the sixth transistor Q6 and the second output 2d is connected to the drain electrode of the fourth transistor Q4. The shifted voltage is a second voltage which is different from a first voltage appearing at the first output node 2c, which changes in phase with respect to the first voltage, and which is applied to the second output node 2d of the voltage-current conversion circuit 2. This voltage-shift means comprises a p-type MOS transistor Q18 (hereinafter called the eighteenth transistor) in which the source electrode is connected to the second output node 2d and the drain and gate electrodes are connected to the first output node 2c in common.

The first output node 2c of the voltage-current conversion circuit 2 is connected to the input node 5a of the second conversion section 5 in the signal conversion circuit 3, and the second output node 2d of the voltage-current conversion circuit 2 is connected to the input node 4a of the first conversion section 4 in the signal conversion circuit 3.

The voltage appearing at the first output node 2c in the voltage-current conversion circuit 2 when no signal is applied is set such that it equals the bias voltage applied to the gate electrode of the fifteenth transistor Q15 of the second conversion section 5 in the signal conversion circuit 3, and the voltage appearing at the second output node 2d in the voltage-current conversion circuit 2 when no signal is applied is set to the voltage appearing at the first output node 2c when no signal is applied plus the source-drain voltage, $V_{GS}$ (voltage drop as a diode), of the eighteenth transistor Q18, namely, set to the same voltage as the bias voltage applied to the gate electrode of the ninth transistor Q9 in the first conversion section 4 of the signal conversion circuit 3.

The ninth embodiment configured as above has the same advantages as the third embodiment, shown in FIG. 7.

Tenth Embodiment

Figure 15:
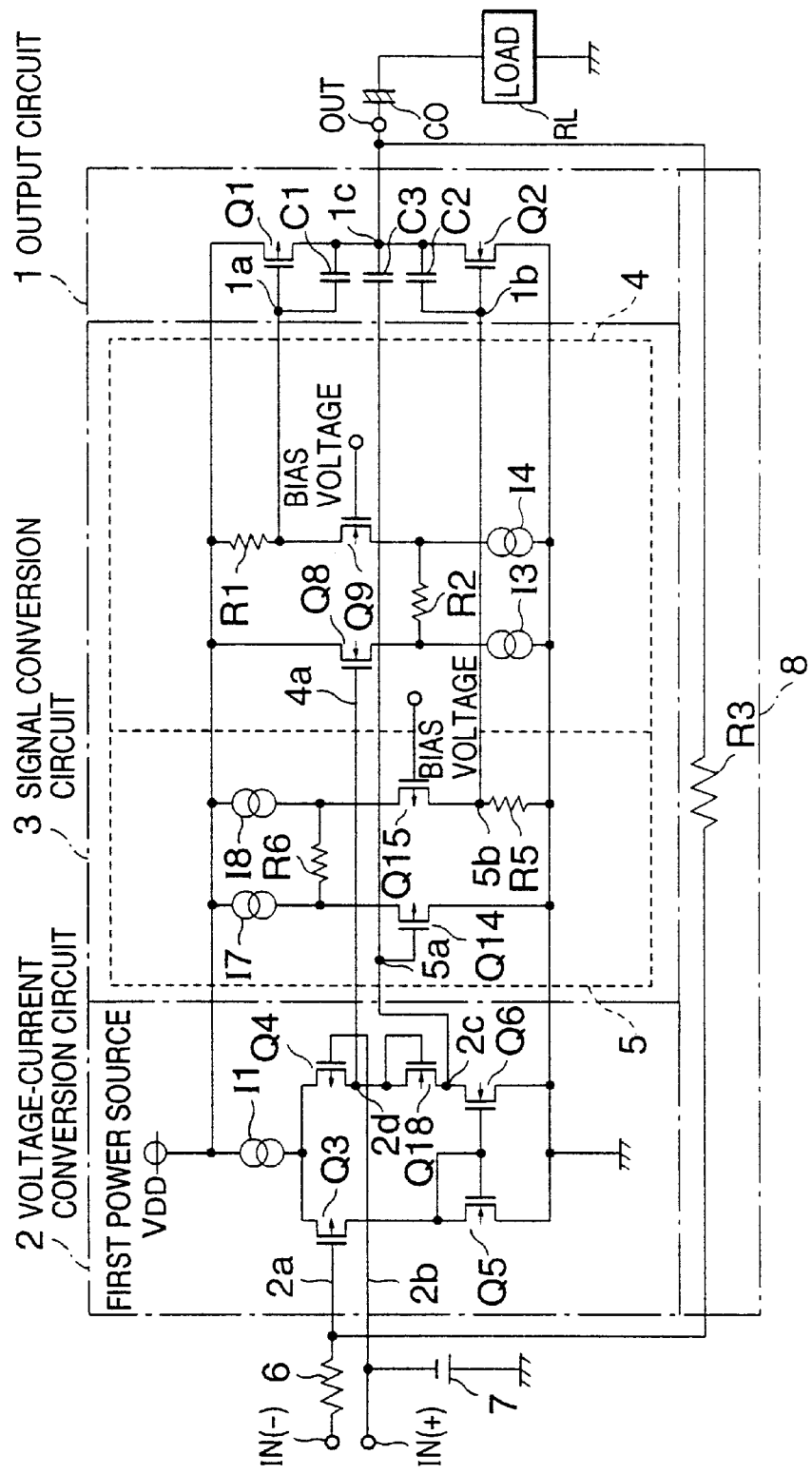
FIG. 15 is a circuit diagram showing a tenth embodiment of the present invention.

FIG. 15 shows an amplifier circuit using a class-AB CMOS operational amplifier (hereinafter called op amp) according to a tenth embodiment of the present invention. The tenth embodiment is the same as the ninth embodiment, shown in FIG. 14, except that voltage-shift means comprises an n-type MOS transistor Q18 whereas, in the ninth embodiment, the voltage-shift means comprises the p-type MOS transistor Q18.

Figure 16:
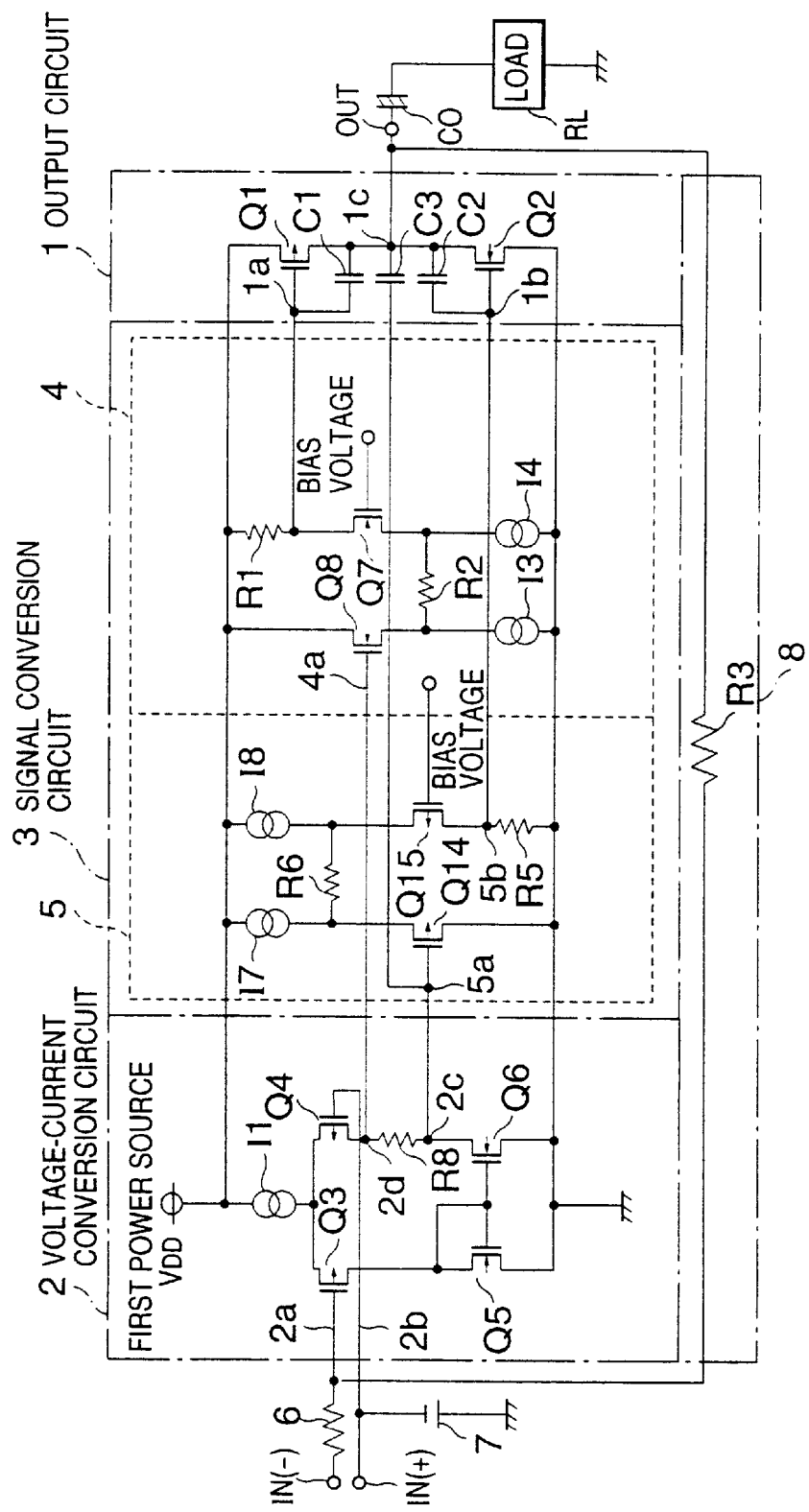
FIG. 16 is a circuit diagram showing an eleventh embodiment of the present invention.

The tenth embodiment configured as described above has the same advantages as the ninth embodiment Eleventh Embodiment FIG. 16 shows an amplifier circuit according to an eleventh embodiment of the present invention The eleventh embodiment is the same as the ninth embodiment, shown in FIG. 14, except that voltage-shift means comprises, for example, a resistive component formed by a polysilicon layer whereas, in the ninth embodiment, the voltage-shift means comprises the p-type MOS transistor Q18.

The eleventh embodiment configured as described above has the same advantages as the ninth embodiment

What is claimed is:

1. An amplifier circuit comprising:

an output circuit having a first conductivity-type MOS transistor connected between a first power-voltage node and an output node, a gate electrode thereof being connected to a first input node, and a second conductivity-type MOS transistor connected between a second power-voltage node and said output node, a gate electrode thereof being connected to a second input node;

a voltage-current conversion circuit having an inverted-input node to which an input signal is input and a non-inverted-input node to which a comparison voltage is applied, and outputting a value according to a voltage difference between said input signal and said comparison voltage;

a signal conversion circuit for controlling a voltage of said second input node in said output circuit using as a reference a second specified voltage and also for controlling a voltage of the first input node in said output circuit using as a reference a first specified voltage, according to said output of said voltage-current conversion circuit, said signal conversion circuit comprising a non-gated resistor component, a current flowing through the non-gated resistor component being controlled by said output of said voltage-current conversion circuit so that a voltage of the first input node is controlled by the current flowing through the non-gated resistor component; and a feedback circuit connected between said output node of said output circuit and said inverted-input node of said voltage-current conversion circuit.

2. An amplifier circuit according to claim 1, wherein said output value of said voltage-current conversion circuit changes according to the voltage difference between said input signal and said comparison voltage with reference to the second specified voltage, and wherein said signal conversion circuit has a second conversion section for receiving said output of said voltage-current conversion circuit and for transferring the received output to said second input node of said output circuit, and a first conversion section for receiving said output of said voltage-current conversion circuit and for applying to said first input node of said output circuit a voltage varying in phase with respect to the output of said voltage-current conversion circuit according to the received output using as a reference the first specified voltage.

3. An amplifier circuit according to claim 2, wherein said signal conversion circuit has a level-shift section for receiving the output of said voltage-current conversion circuit, for shifting the received output voltage, and for applying it to said first and second conversion sections.

4. An amplifier circuit according to claim 1, wherein said voltage-current conversion circuit includes a differential pair having a first MOS transistor, a gate electrode thereof being connected to an inverted-input node to which a signal is input, and a second MOS transistor, a gate electrode thereof being connected to a non-inverted-input node to which the comparison voltage is input and a source electrode thereof being connected to a source electrode of the first MOS transistor, said voltage-current conversion circuit outputting from the drain electrode of the second MOS transistor a value according to a voltage difference between said input signal and said comparison voltage.

5. An amplifier circuit according to claim 1, wherein said signal conversion circuit is provided a source voltage that is higher than that of said output circuit.

6. An amplifier circuit according to claim 1, wherein:

said second power-voltage node is a ground-voltage node; and said first specified voltage is lower than a power voltage applied to said first power-voltage node and higher than said second specified voltage.

7. An amplifier circuit comprising:

an output circuit having a p-type MOS transistor connected between a power-voltage node and an output node, a gate electrode thereof being connected to a first input node, and an n-type node MOS transistor connected between a ground-voltage node and said output node, a gate electrode thereof being connected to a second input node;

a voltage-current conversion circuit having an inverted-input node to which an input signal is applied and a non-inverted-input node to which a comparison voltage is input, and outputting a value according to a voltage difference between said input signal and said comparison voltage;

a signal conversion circuit for controlling a voltage of said second input node in said output circuit using as a reference a second specified voltage higher than a voltage applied to said ground-voltage node and also for controlling a voltage of said first input node in said output circuit using as a reference a first specified voltage which is lower than a power voltage applied to said power-voltage node and higher than said second specified voltage, according to the output of said voltage-current conversion circuit, said signal conversion circuit comprising a current resistance, a current flowing through the resistance being controlled by said output of said voltage-current conversion circuit so that a voltage of the first input node is controlled by the current flowing through the resistance; and a feedback circuit connected between said output node of said output circuit and said inverted-input node of said voltage-current conversion circuit.

8. An amplifier circuit comprising:

an output circuit having a p-type MOS transistor connected between a power-voltage node and an output node a gate electrode thereof being connected to a first input node, an n-type MOS transistor connected between a ground-voltage node and said output node, a gate electrode thereof being connected to a second input node, a first capacitive component connected between said gate electrode of said p-type MOS transistor and said output node, and a second capacitive component connected between said gate electrode of said n-type MOS transistor and said output node;

a control circuit having an inverted-input node to which an input signal is applied and a non-inverted-input node to which a comparison voltage is input, said control circuit controlling a voltage of said first input node in said output circuit using as a reference a first specified voltage and also controlling the voltage of said second input node in said output circuit using as a reference a second specified voltage, according to a voltage difference between said input signal and said comparison voltage, said control circuit comprising a current resistance, a current flowing through the resistance being controlled by said output of said voltage-current conversion circuit so that a voltage of the first input node is controlled by the current flowing through the resistance; and a feedback circuit connected between said output node of said output circuit and said inverted-input node of said control circuit.

9. An amplifier circuit comprising:

an output circuit having a p-type MOS transistor connected between a power-voltage node and an output node, a gate electrode thereof being connected to a first input node, an n-type MOS transistor connected between a ground-voltage node and said output node, a gate electrode thereof being connected to a second intput node, a first capacitive component connected between said gate electrode of said p-type MOS transistor and said output node, and a second capacitive component connected between said gate electrode of said n-type MOS transistor and said output node;

a voltage-current conversion circuit having an inverted-input node to which an input signal is applied and a non-inverted-input node to which a comparison voltage is input, said voltage-current conversion circuit outputting a value according to a voltage difference between said input signal and said comparison voltage;

a signal conversion circuit having a first conversion section for receiving an output of said voltage-current conversion circuit and for applying a voltage varying in phase with an output of said voltage-current conversion circuit according to the received output using as a reference a first specified voltage to said first input node of said output circuit, and a second conversion section for receiving an output of said voltage-current conversion circuit and for applying a voltage varying in phase with the output of said voltage-current conversion circuit according to the received output using as a reference a second specified voltage to said second input node of said output circuit, said first conversion section comprising a current resistance, a current flowing through the resistance being controlled by said output of said voltage-current conversion circuit so that a voltage of the first input node is controlled by the current flowing through the resistance a third capacitive component connected between an output node of said voltage-current conversion circuit and an output node of said output circuit; and a feedback circuit connected between said output node of said output circuit and said inverted-input node of said voltage-current conversion circuit.

10. An amplifier circuit comprising:

an output circuit having a p-type MOS transistor connected between a power-voltage node and an output node, a gate electrode thereof being connected to a first input node, and an n-type MOS transistor connected between a ground-voltage node and said output node, a gate electrode thereof being connected to a second input node;

a voltage-current conversion circuit having an inverted-input node to which an input signal is applied and a non-inverted-input node to which a comparison voltage is input, said voltage-current conversion circuit outputting a first value according to a voltage difference between said input signal and said comparison voltage and a second value varying in phase with the first value and different from the first value;

a signal conversion circuit for controlling a voltage of the second input node in said output circuit with reference to a second specified voltage higher than a voltage applied to said ground-voltage node according to a first-value output of said voltage-current conversion circuit and also for controlling a voltage of said first input node in said output circuit using as reference a first specified voltage which is lower than a power voltage applied to said power-voltage node and higher than a second specified voltage according to a second-value output of said voltage-current conversion circuit, said signal conversion circuit comprising a current resistance, a current flowing through the resistance being controlled by said output of said voltage-current conversion circuit so that a voltage of the first input node is controlled by the current flowing through the resistance; and a feedback circuit connected between said output node of said output circuit and said inverted-input node of said voltage-current conversion circuit.

11. An amplifier circuit according to claim 10, wherein said signal conversion circuit has a second conversion section for receiving the first-value output of said voltage-current conversion circuit and for transferring the received output to the second input node of said output circuit, and a first conversion section for receiving the second-value output of said voltage-current conversion circuit and for applying the voltage varying in phase with respect to the received output to the first input node of said output circuit.

12. An amplifier circuit comprising:

an output circuit having a first transistor comprising a p-type MOS transistor connected between a power-voltage node and an output node, a gate electrode thereof being connected to a first input node, and a second transistor comprising an n-type MOS transistor connected between a ground-voltage node and said output node, a gate electrode thereof being connected to a second input node;

a voltage-current conversion circuit having an inverted-input node to which an input signal is applied, a non-inverted-input node to which a comparison voltage is input, a third transistor comprising a MOS transistor having a gate electrode connected to said inverted-input node, a fourth transistor comprising a MOS transistor having a gate electrode connected to said non-inverted-input node, a source electrode connected to a source electrode of the third transistor to form a differential pair of transistors with the third transistor, and a drain electrode is connected to a second output node, a fifth transistor having a drain electrode and a gate electrode connected in common to the drain electrode of the third transistor, a sixth transistor having a gate electrode connected to the gate electrode of the fifth transistor to form a current mirror circuit with the fifth transistor and the drain electrode is connected to a first output node, and voltage-shift means connected between the first output node and the second output node for shifting the voltage of the first output node to apply to the voltage of the second output node;

a signal conversion circuit for receiving a voltage of the first output node of said voltage-current conversion circuit and for controlling a voltage of the second input node in said output circuit with reference to a second specified voltage higher than a voltage applied to said ground-voltage node, and also for receiving a voltage of the second output node of said voltage-current conversion circuit and for controlling a voltage of the first input node in said output circuit with reference to a first specified voltage which is lower than the power voltage applied to said power-voltage node and higher than the second specified voltage; and a feedback circuit connected between said output node of said output circuit and said inverted-input node of said voltage-current conversion circuit.

13. An amplifier circuit according to claim 12, wherein said signal conversion circuit has a second conversion section for receiving the voltage of said first output node of said voltage-current conversion circuit and for transferring the received voltage to said second input node of said output circuit, and a first conversion section for receiving the voltage of the second output node of said voltage-current conversion circuit and for applying the voltage varying in phase with the received voltage to the first input node of said output circuit.

14. An amplifier circuit according to claim 12, wherein said voltage shift means includes a p-type MOS transistor.

15. An amplifier circuit according to claim 12, wherein said voltage shift means includes an n-type MOS transistor.

16. An amplifier circuit according to claim 12, wherein said voltage shift means includes a polysilicon layer.

17. An amplifier circuit comprising:

an output circuit including a first transistor of one conductivity type having a gate electrode connected to a first input node, a source electrode connected to a first power-voltage node, and a drain electrode connected to an output node and further including a second transistor of another conductivity type having a gate electrode connected to a second input node, a source electrode connected to a ground-voltage node, and a drain electrode connected to said output node;

a voltage-current conversion circuit for outputting to an output node a value proportional to the voltage difference between a signal input to an inverted-input node and a reference voltage input to a non-inverted-input node;

a signal conversion circuit for receiving said value at said output node of said voltage-current conversion circuit and for controlling current flowing into said first input node and flowing into said second input node of said output circuit and its corresponding voltages, wherein said signal conversion circuit comprises a first conversion section for controlling said gate electrode of said first transistor in said output circuit, and a second conversion section for controlling said gate electrode of said second transistor in said output circuit, and wherein said first conversion section generates a voltage according to a voltage output from said second conversion section.

18. An amplifier circuit comprising:

an output circuit including a first transistor of one conductivity type having a gate electrode connected to a first input node, a source electrode connected to a first power-voltage node, and a drain electrode connected to an output node and further including a second transistor of another conductivity type having a gate electrode connected to a second input node, a source electrode connected to a ground-voltage node, and a drain electrode connected to said output node;

a voltage-current conversion circuit for outputting to an output node a value proportional to the voltage difference between a signal input to an inverted-input node and a reference voltage input to a non-inverted-input node;

a signal conversion circuit for receiving said value at said output node of said voltage-current conversion circuit and for controlling current flowing into said first input node and flowing into said second input node of said output circuit and its corresponding voltages, wherein said signal conversion circuit comprises a first conversion section for controlling said gate electrode of said first transistor in said output circuit, and a second conversion section for controlling said gate electrode of said second transistor in said output circuit; and a feedback circuit connected between the output node of the output circuit and the inverted-input node of the voltage-current conversion circuit.

* * * * *